United States Patent
Zhang et al.

(10) Patent No.: US 12,550,556 B2
(45) Date of Patent: Feb. 10, 2026

(54) DISPLAY SUBSTRATE, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Yue Long, Beijing (CN); Zhengkun Li, Beijing (CN); De Li, Beijing (CN); Zhongliu Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 435 days.

(21) Appl. No.: 18/022,541

(22) PCT Filed: Apr. 22, 2022

(86) PCT No.: PCT/CN2022/088423
§ 371 (c)(1),
(2) Date: Feb. 22, 2023

(87) PCT Pub. No.: WO2023/201692
PCT Pub. Date: Oct. 26, 2023

(65) Prior Publication Data
US 2024/0292681 A1 Aug. 29, 2024

(51) Int. Cl.
*H10K 59/12* (2023.01)
*H10K 59/131* (2023.01)

(52) U.S. Cl.
CPC ....... *H10K 59/131* (2023.02); *H10K 59/1201* (2023.02)

(58) Field of Classification Search
CPC ... H10D 86/00; H10K 59/1201; H10K 59/131
See application file for complete search history.

(56) References Cited

U.S. PATENT DOCUMENTS 11,686,986 B2 *  6/2023  Zhao ............... G02F 1/1345
                                                    349/33
11,800,764 B2 * 10/2023  Cho ................ H10K 59/131
(Continued)

FOREIGN PATENT DOCUMENTS

CN   107305757 A   10/2017
CN   108766984 A   11/2018
(Continued)

*Primary Examiner* — Jaehwan Oh
(74) *Attorney, Agent, or Firm* — WHDA, LLP

(57) ABSTRACT

The present disclosure provides a display substrate, a method for manufacturing the same, and a display device. The display substrate comprises a base substrate, at least four metal layers laminated in a direction away from the base substrate, a display region, a frame region arranged on at least one side of the display region, and a plurality of data lines are at least partially arranged in the display region, wherein an insulating layer is provided between two adjacent the metal layers; in the frame region, the metal layer comprises a plurality of data signal leads; the data signal leads are coupled to the corresponding data lines; and orthographic projections of the data signal leads of at least two of the metal layers on the base substrate are at least partially overlapped.

14 Claims, 17 Drawing Sheets

(56) References Cited

U.S. PATENT DOCUMENTS

| | | | |
|---|---|---|---|
| 2017/0309644 A1 | 10/2017 | Yeh | |
| 2019/0018526 A1* | 1/2019 | Fu | G06F 3/047 |
| 2020/0066819 A1 | 2/2020 | Song et al. | |
| 2021/0257438 A1* | 8/2021 | Cho | H10K 59/88 |

FOREIGN PATENT DOCUMENTS

| | | |
|---|---|---|
| CN | 108878444 A | 11/2018 |
| CN | 108878484 A | 11/2018 |
| CN | 209055780 U | 7/2019 |
| CN | 111367129 A | 7/2020 |
| KR | 20150002344 A | 1/2015 |

* cited by examiner

DISPLAY SUBSTRATE, MANUFACTURING METHOD THEREOF, AND DISPLAY DEVICE

CROSS REFERENCE TO RELATED APPLICATION

The present application is the U.S. National Phase of International Application No. PCT/CN2022/088423, filed Apr. 22, 2022, the entire content of which is incorporated herein by reference.

TECHNICAL FIELD

The present disclosure relates to the technical field of displays, and more particularly, relates to a display substrate, a method for manufacturing the same, and a display device.

BACKGROUND

AMOLED (active-matrix organic light-emitting diode) display devices have many advantages, such as self-luminescence, wide color gamut, high contrast, flexibility, high response, and the like, and have a wide application prospect. With the rapid development of AMOLED displays, customers have higher and higher requirements on the whole machine effect and display effect, thus the concept of the ultra-narrow frame is proposed. In order to realize the function of large-angle bending on four sides, improve the problem of module fitting wrinkle, and improve the yield of display products, it is necessary to narrow the width of the lower frame of the display substrate and the lower rounded corner region of the display substrate.

SUMMARY

In one aspect, embodiments of the present disclosure provide a display substrate, comprising a base substrate, at least four metal layers laminated in a direction away from the base substrate, a display region, a frame region arranged on at least one side of the display region, and a plurality of data lines are at least partially arranged in the display region, wherein
  an insulating layer is provided between two adjacent the metal layers;
  in the frame region, the metal layer comprises a plurality of data signal leads;
  the data signal leads are coupled to the corresponding data lines; and
  orthographic projections of the data signal leads of at least two of the metal layers on the base substrate are at least partially overlapped.

Optionally, the at least four metal layers comprise: a first gate metal layer, a second gate metal layer, a first source and drain metal layer, and a metal wiring layer which are successively arranged on the base substrate, wherein
  the first gate metal layer comprises a plurality of first data signal leads, the second gate metal layer comprises a plurality of second data signal leads, the first source and drain metal layer comprises a plurality of third data signal leads, and the metal wiring layer comprises a plurality of fourth data signal leads.

Optionally, the display substrate according to at least one embodiment of the present disclosure further comprises a plurality of power lines arranged in the display region, wherein
  the power lines are arranged on the same layer as the third data signal leads.

Optionally, the display substrate further comprises a second source and drain metal layer, wherein the second source and drain metal layer is arranged on a side of the metal wiring layer away from the first source and drain metal layer; the second source and drain metal layer comprises the data lines.

Optionally, the orthographic projection of the first data signal leads on the base substrate partially overlaps the orthographic projection of the third data signal leads on the base substrate;
  the orthographic projection of the first data signal leads on the base substrate partially overlaps the orthographic projection of the fourth data signal leads on the base substrate; and
  the orthographic projection of the second data signal leads on the base substrate partially overlaps the orthographic projection of the fourth data signal leads on the base substrate.

Optionally, the orthographic projection of the second data signal leads on the base substrate partially overlaps the orthographic projection of the third data signal leads on the base substrate.

Optionally, the orthographic projection of the first data signal leads on the base substrate does not overlap the orthographic projection of the second data signal leads on the base substrate, and the orthographic projection of the third data signal leads on the base substrate does not overlap the orthographic projection of the fourth data signal leads on the base substrate.

Optionally, the shortest distance between the orthographic projection of the first data signal leads on the base substrate and the orthographic projection of the second data signal leads on the base substrate is within a first distance range;
  the shortest distance between the orthographic projection of the third data signal leads on the base substrate and the orthographic projection of the fourth data signal leads on the base substrate is within a second distance range; and
  the first distance range is greater than or equal to 0.3 um and less than or equal to 0.8 um, and the second distance range is greater than or equal to 0.3 um and less than or equal to 0.8 um.

Optionally, the frame region comprises a first region, wherein
  in the first region, the first data signal leads comprise a first lead portion extending in a first direction, the second data signal leads comprise a second lead portion extending in the first direction, the third data signal leads comprise a third lead portion extending in the first direction, and the fourth data signal leads comprise a fourth lead portion extending in the first direction; the orthographic projection of the first lead portion on the base substrate partially overlaps the orthographic projection of the third lead portion on the base substrate; the orthographic projection of the first lead portion on the base substrate partially overlaps the orthographic projection of the fourth lead portion on the base substrate; and the orthographic projection of the second data signal leads on the base substrate partially overlaps the orthographic projection of the fourth data signal leads on the base substrate;
  in the first region, the region where the orthographic projection of the first lead portion on the base substrate overlaps with the orthographic projection of the third lead portion on the base substrate is a first overlapping region, the region where the orthographic projection of the first lead portion on the base substrate overlaps with the orthographic projection of the fourth lead portion on the base substrate is a second overlapping region, and the region where the orthographic projection of the second lead portion on the base substrate overlaps with the orthographic projection of the fourth lead portion on the base substrate is a third overlapping region;

a maximum width of the first overlapping region in a second direction is within a first width range; the maximum width of the second overlapping region in the second direction is within a second width range; the maximum width of the third overlapping region in the second direction is within a third width range;

the second direction intersects the first direction; and the first width range is greater than or equal to 0.2 um and less than or equal to 0.4 um, the second width range is greater than or equal to 0.2 um and less than or equal to 0.5 um, and the third width range is greater than or equal to 0.7 um and less than or equal to 1.6 um.

Optionally, the frame region comprises a first region, wherein in the first region, the second data signal leads comprise the second lead portion extending in the first direction and the third data signal leads comprise the third lead portion extending in the first direction; the orthographic projection of the second lead portion on the base substrate partially overlaps the orthographic projection of the third lead portion on the base substrate;

the region where the orthographic projection of the second lead portion on the base substrate overlaps with the orthographic projection of the third lead portion on the base substrate is a fourth overlapping region;

the maximum width of the fourth overlapping region in the second direction is within a fourth width range;

the second direction intersects the first direction; and the fourth width range is greater than or equal to 0.1 um and less than or equal to 0.5 um.

Optionally, the frame region comprises the first region, a first rounded corner region provided on a first side of the first region, and a second rounded corner region provided on a second side of the first region, wherein the first side and the second side are opposite to each other;

in the first and the second rounded corner regions, the region where the orthographic projection of the first data signal leads on the base substrate overlaps with the orthographic projection of the third data signal leads on the base substrate is a fifth overlapping region, an edge of the fifth overlapping region comprises a first side edge and a second side edge which are arranged opposite to each other, and the lengths of the first side edge and the second side edge are both greater than the lengths of the other side edges of the edge of the fifth overlapping region, the longest distance in a third direction between a point on the first side edge and the second side edge is within a third distance range, and the third direction intersects a direction in which a tangent to the first side edge extends at the point;

in the first and the second rounded corner regions, the region where the orthographic projection of the first data signal leads on the base substrate overlaps with the orthographic projection of the fourth data signal leads on the base substrate is a sixth overlapping region, the sixth overlapping region comprises a third side edge and a fourth side edge which are arranged opposite to each other, and the lengths of the third side edge and the fourth side edge are both greater than the lengths of the other side edges of the edge of the sixth overlapping region, the longest distance in a fourth direction between a point on the third side edge and the fourth side edge is within a fourth distance range, and the fourth direction intersects a direction in which a tangent to the third side edge extends at the point;

in the first and the second rounded corner regions, the region where the orthographic projection of the second data signal leads on the base substrate overlaps with the orthographic projection of the fourth data signal leads on the base substrate is a seventh overlapping region, the seventh overlapping region comprises a fifth side edge and a sixth side edge which are arranged opposite to each other, and the lengths of the fifth side edge and the sixth side edge are both greater than the lengths of the other side edges of the edge of the seventh overlapping region, the longest distance in a fifth direction between a point on the fifth side edge and the sixth side edge is within a fifth distance range, and the fifth direction intersects a direction in which a tangent to the fifth side edge extends at the point; and the third distance range is greater than or equal to 0.2 um and less than or equal to 0.4 um, the fourth distance range is greater than or equal to 0.2 um and less than or equal to 0.5 um, and the fifth distance range is greater than or equal to 0.7 um and less than or equal to 1.6 um.

Optionally, the frame region comprises the first region, a first rounded corner region provided on a first side of the first region, and a second rounded corner region provided on a second side of the first region, wherein the first side and the second side are opposite to each other;

in the first and the second rounded corner regions, the region where the orthographic projection of the second data signal leads on the base substrate overlaps with the orthographic projection of the third data signal leads on the base substrate is a eighth overlapping region, the eighth overlapping region comprises a seventh side edge and an eighth side edge which are arranged opposite to each other, and the lengths of the seventh side edge and the eighth side edge are both greater than the lengths of the other side edges of the edge of the eighth overlapping region, the longest distance in a sixth direction between a point on the seventh side edge and the eighth side edge is within a sixth distance range, and the sixth direction intersects a direction in which a tangent to the seventh side edge extends at the point;

the sixth distance range is greater than or equal to 0.1 um and less than or equal to 0.5 um.

Optionally, the line widths of the first data signal leads, the second data signal leads, the third data signal leads, and the fourth data signal leads are all within a line width range; the line width range is greater than or equal to 1.6 um and less than or equal to 2.2 um.

In a second aspect, the embodiments of the present disclosure provide a method for manufacturing the display substrate, wherein the at least four metal layers of the display substrate comprise: a first metal layer, a second metal layer, a third metal layer, and a fourth metal layer; the method for manufacturing the display substrate comprises:

manufacturing the first metal layer on the base substrate and performing a patterning process on the first metal layer to form the first data signal leads in the frame region;

manufacturing the insulating layer and the second metal layer successively on one side of the first metal layer away from the base substrate and performing a patterning process on the second metal layer to form the second data signal leads in the frame region;

manufacturing the insulating layer and the third metal layer successively on one side of the second metal layer away from the base substrate and performing a patterning process on the third metal layer to form the third data signal leads in the frame region;

manufacturing the insulating layer and the fourth metal layer successively on one side of the third metal layer away from the base substrate and performing a patterning process on the fourth metal layer to form the fourth data signal leads in the frame region; and orthographic projections of the data signal leads of at least two non-adjacent the metal layers on the base substrate are at least partially overlapped.

In a third aspect, the embodiments of the present disclosure provide a display device comprising the display substrate.

Optionally, the display device according to at least one embodiment of the present disclosure further comprises a source driver provided in the frame region of the display substrate;

the source driver is electrically connected to a plurality of data signal leads of the display substrate for supplying corresponding data voltages to the plurality of data signal leads.

DETAILED DESCRIPTION

Figure 1A:
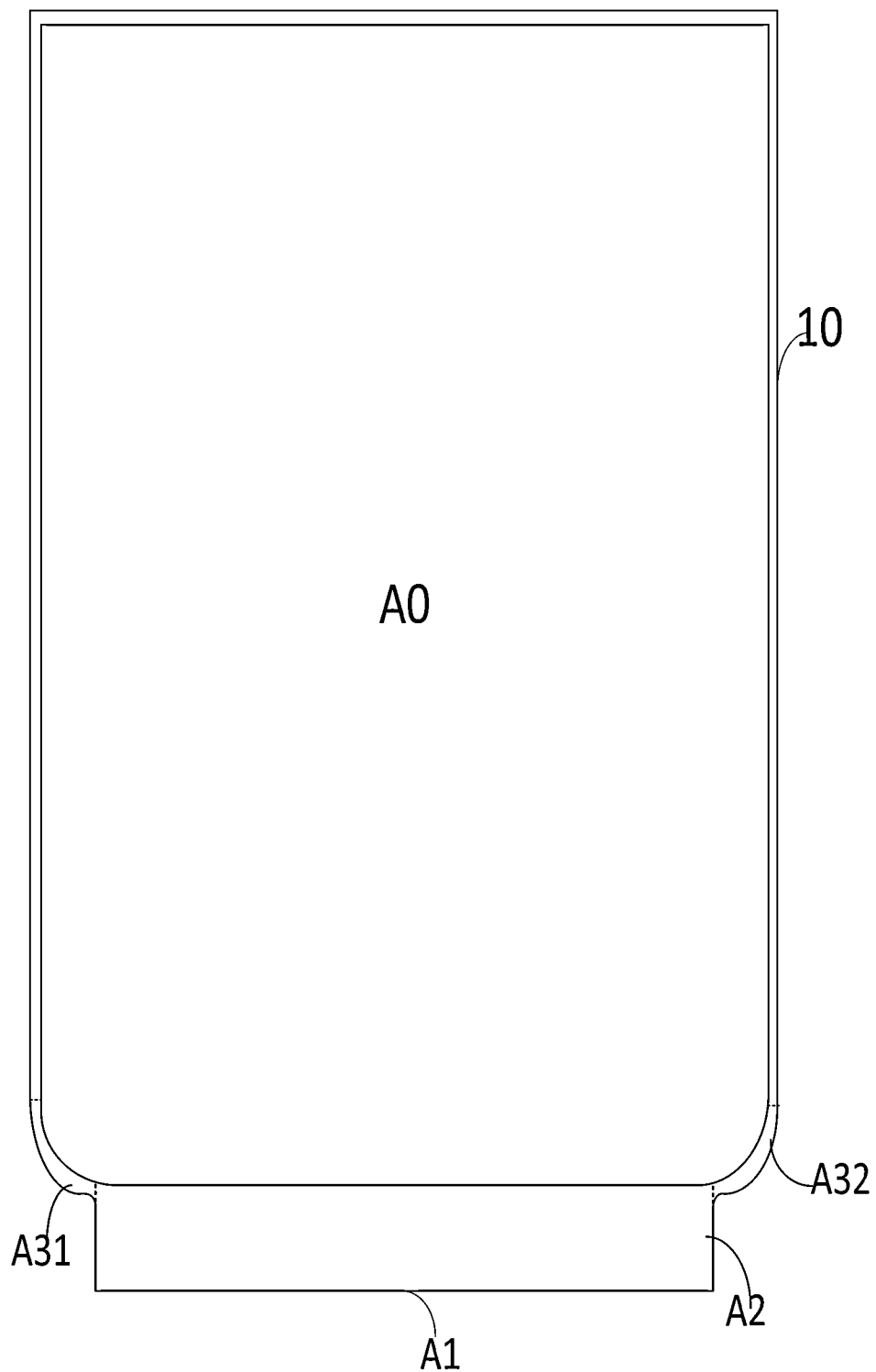
FIG. 1A is a schematic diagram of a display substrate according to at least one embodiment of the present disclosure.

Technical solutions of the embodiments of the present disclosure will be described clearly and completely with reference to the drawings. It should be understood that the embodiments described are merely part of, but not all, embodiments of the present disclosure. Based on the embodiments in the present disclosure, all other embodiments obtained by those skilled in the art without inventive effort are within the scope of the present disclosure.

The transistors used in all embodiments of the present disclosure may be triodes, thin film transistors, field effect transistors, or other devices with the same characteristics. In embodiments of the present disclosure, to distinguish between two poles of a transistor other than a control pole, one of the poles is referred to as a first pole and the other pole is referred to as a second pole.

In practical operation, when the transistor is a thin film transistor or a field effect transistor, the first pole may be a drain pole, and the second pole may be a source pole; alternatively, the first pole may be a source pole and the second pole may be a drain pole.

A display substrate according to an embodiment of the present disclosure comprises a base substrate, at least four metal layers laminated in a direction away from the base substrate, a display region, a frame region arranged on at least one side of the display region, and a plurality of data lines are at least partially arranged in the display region, wherein
- an insulating layer is provided between two adjacent the metal layers;
- in the frame region, the metal layer comprises a plurality of data signal leads;
- the data signal leads are coupled to the corresponding data lines; and
- orthographic projections of the data signal leads of at least two of the metal layers on the base substrate are at least partially overlapped.

The display substrate according to the embodiment of the present disclosure can effectively narrow the width of the lower frame of the display substrate and the lower rounded corner region of the display substrate by arranging the data signal leads on at least four metal layers, and arranging the orthographic projection of the data signal leads comprised in at least two of the metal layers on the base substrate to at least partially overlap, wherein at least part of the data signal leads are arranged in the fan-out region to reduce the fanout pitch (fan-out spacing), thereby facilitating the realization of a narrow frame.

The embodiments of the present disclosure can effectively narrow the width of the lower frame of the display substrate and the lower rounded corner region of the display substrate, thus realizing the function of large-angle bending on four sides, improving the problem of module fitting wrinkle, and improving the yield of display products.

In the frame region of the display substrate according to the embodiment of the present disclosure, a source driver is provided, and the source driver is electrically connected to a plurality of data signal leads of the display substrate for supplying corresponding data voltages to the plurality of data signal leads.

In at least one embodiment of the present disclosure, an overlapping region of the orthographic projection of the data signal leads of at least two of the metal layers on the base substrate are at least partially disposed in the fan-out region, but is not limited thereto.

Optionally, the at least four metal layers comprise: a first gate metal layer, a second gate metal layer, a first source and drain metal layer, and a metal wiring layer which are successively arranged on the base substrate, wherein
- the first gate metal layer comprises a plurality of first data signal leads, the second gate metal layer comprises a plurality of second data signal leads, the first source and drain metal layer comprises a plurality of third data signal leads, and the metal wiring layer comprises a plurality of fourth data signal leads.

At least one embodiment of the present disclosure provides a metal wiring layer between a first source and drain metal layer and a second source and drain metal layer, performs a patterning process on the metal wiring layer to form a plurality of the fourth data signal leads, realizes the layout of data signal leads comprised in different layers of metal layers, and can reduce a wiring pitch (spacing) by overlapping at least two data signal leads comprised in the metal layers, and effectively narrows the width of a lower frame and a lower rounded corner of a display substrate, facilitating the realization of a narrow frame.

Optionally, the metal wiring layer may be a laminated structure, and the metal wiring layer may comprise a first titanium metal layer, an aluminum metal layer, and a second titanium metal layer which are laminated along a side of the first source and drain metal layer away from the base substrate, and the aluminum metal layer is arranged between the first titanium metal layer and the second titanium metal layer, but is not limited thereto.

In at least one embodiment of the present disclosure, the display substrate may further comprise a first insulating layer, a second insulating layer, a third insulating layer, and a fourth insulating layer, wherein
- the first insulating layer is arranged between the first gate metal layer and the second gate metal layer;
- the second insulating layer is arranged between the second gate metal layer and the third insulating layer; the third insulating layer is arranged between the second insulating layer and the first source and drain metal layer; and
- the fourth insulating layer is arranged between the first source and drain metal layer and the metal wiring layer.

In particular implementations, the first insulating layer may be provided between the first gate metal layer and the second gate metal layer, the second insulating layer and the third insulating layer may be provided between the second gate metal layer and the first source and drain metal layer, and the fourth insulating layer may be provided between the first source and drain metal layer and the metal wiring layer. In order to ensure that the data signal leads comprised in two adjacent metal layers which are nearer to each other do not cross-talk with each other, the first data signal lead and the second data signal lead may be set so as not to overlap with each other, the third data signal lead and the fourth data signal lead may be set so as not to overlap with each other, and the first data signal lead may be set at a certain distance from the second data signal lead, and the third data signal lead may be set at a certain distance from the fourth data signal lead, and the second data signal lead and the third data signal lead are set to have a small overlapping area (since two insulating layers are provided between the second gate metal layer and the first source and drain metal layer, the distance is relatively far). However, in order to reduce the wiring pitch, the data signal leads comprised in two non-adjacent metal layers can be arranged to overlap each other, and the overlapping area is relatively large, i.e., the first data signal lead and the third data signal lead can be arranged to overlap each other, the first data signal lead and the fourth data signal lead can be arranged to overlap each other, and the second data signal lead and the fourth data signal lead can be arranged to overlap each other.

Optionally, the first insulating layer, the second insulating layer, the third insulating layer, and the fourth insulating layer may be inorganic insulating layers, but is not limited thereto. For example, the first insulating layer may be made of SiNx, the second insulating layer may be made of SiO2, the third insulating layer may be made of SiNx, and the fourth insulating layer may be made of SiNx, but is not limited thereto.

In at least one embodiment of the present disclosure, the orthographic projection of the first data signal lead on the base substrate partially overlaps the orthographic projection of the third data signal lead on the base substrate, the orthographic projection of the first data signal lead on the base substrate partially overlaps the orthographic projection of the fourth data signal lead on the base substrate, and the orthographic projection of the second data signal lead on the base substrate partially overlaps the orthographic projection of the fourth data signal lead on the base substrate to reduce the area occupied by the orthographic projection of the four data signal leads electrically connected to the adjacent four data lines (the four data signal leads are respectively: the first data signal lead, the second data signal lead, the third data signal lead, and the fourth data signal lead) on the base substrate.

In at least one embodiment of the present disclosure, the orthographic projection of the second data signal lead on the base substrate partially overlaps the orthographic projection of the third data signal lead on the base substrate.

In at least one embodiment of the present disclosure, the orthographic projection of the first data signal leads on the base substrate does not overlap the orthographic projection of the second data signal leads on the base substrate, and the orthographic projection of the third data signal leads on the base substrate does not overlap the orthographic projection of the fourth data signal leads on the base substrate.

Optionally, the shortest distance between the orthographic projection of the first data signal leads on the base substrate and the orthographic projection of the second data signal leads on the base substrate is within a first distance range; the shortest distance between the orthographic projection of the third data signal leads on the base substrate and the orthographic projection of the fourth data signal leads on the base substrate is within a second distance range.

In at least one embodiment of the present disclosure, the first distance range is greater than or equal to 0.3 um and less than or equal to 0.8 um, and the second distance range is greater than or equal to 0.3 um and less than or equal to 0.8 um, but is not limited thereto.

In at least one embodiment of the present disclosure, the frame region comprises a first region, wherein
in the first region, the first data signal leads comprise a first lead portion extending in a first direction, the second data signal leads comprise a second lead portion extending in the first direction, the third data signal leads comprise a third lead portion extending in the first direction, and the fourth data signal leads comprise a fourth lead portion extending in the first direction; the orthographic projection of the first lead portion on the base substrate partially overlaps the orthographic projection of the third lead portion on the base substrate; the orthographic projection of the first lead portion on the base substrate partially overlaps the orthographic projection of the fourth lead portion on the base substrate; and the orthographic projection of the second data signal leads on the base substrate partially overlaps the orthographic projection of the fourth data signal leads on the base substrate;
in the first region, the region where the orthographic projection of the first lead portion on the base substrate overlaps with the orthographic projection of the third lead portion on the base substrate is a first overlapping region, the region where the orthographic projection of the first lead portion on the base substrate overlaps with the orthographic projection of the fourth lead portion on the base substrate is a second overlapping region, and the region where the orthographic projection of the second lead portion on the base substrate overlaps with the orthographic projection of the fourth lead portion on the base substrate is a third overlapping region;
a maximum width of the first overlapping region in a second direction is within a first width range; the maximum width of the second overlapping region in the second direction is within a second width range; the maximum width of the third overlapping region in the second direction is within a third width range; and the second direction intersects the first direction.

Optionally, the first width range is greater than or equal to 0.2 um and less than or equal to 0.4 um, the second width range is greater than or equal to 0.2 um and less than or equal to 0.5 um, and the third width range is greater than or equal to 0.7 um and less than or equal to 1.6 um, but is not limited thereto.

In at least one embodiment of the present disclosure, the frame region comprises a first region, wherein
in the first region, the second data signal leads comprise the second lead portion extending in the first direction and the third data signal leads comprise the third lead portion extending in the first direction; the orthographic projection of the second lead portion on the base substrate partially overlaps the orthographic projection of the third lead portion on the base substrate;
the region where the orthographic projection of the second lead portion on the base substrate overlaps with the orthographic projection of the third lead portion on the base substrate is a fourth overlapping region;
the maximum width of the fourth overlapping region in the second direction is within a fourth width range; and the second direction intersects the first direction.

Optionally, the fourth width range is greater than or equal to 0.1 um and less than or equal to 0.5 um, but is not limited thereto.

In at least one embodiment of the present disclosure, in the first region, the first direction may be perpendicular to the second direction, but is not limited thereto;
the smaller angle between the first direction and the horizontal direction may be less than or equal to 90 degrees, but is not limited thereto.

Optionally, in the frame region, the line widths of the first lead portion, the second lead portion, the third lead portion, and the fourth lead portion are within a line width range.

In at least one embodiment of the present disclosure, the line width range may be greater than or equal to 1.6 um and less than or equal to 2.2 um, but is not limited thereto.

As shown in FIG. 1A, reference numeral 10 denotes a display substrate, reference numeral A denotes a display region, reference numeral A1 denotes a first frame region, reference numeral A2 denotes a first region, reference numeral A31 denotes a first rounded corner region, and reference numeral A32 denotes a third rounded corner region, wherein the first rounded corner region A31 is provided on the left side of the first region A2, and the second rounded corner region A32 is provided on the right side of the first region A2.

As shown in FIG. 1A, the first region may be a rectangular region, and the first frame region is a lower frame region of the display substrate, but is not limited thereto.

Figure 1B:
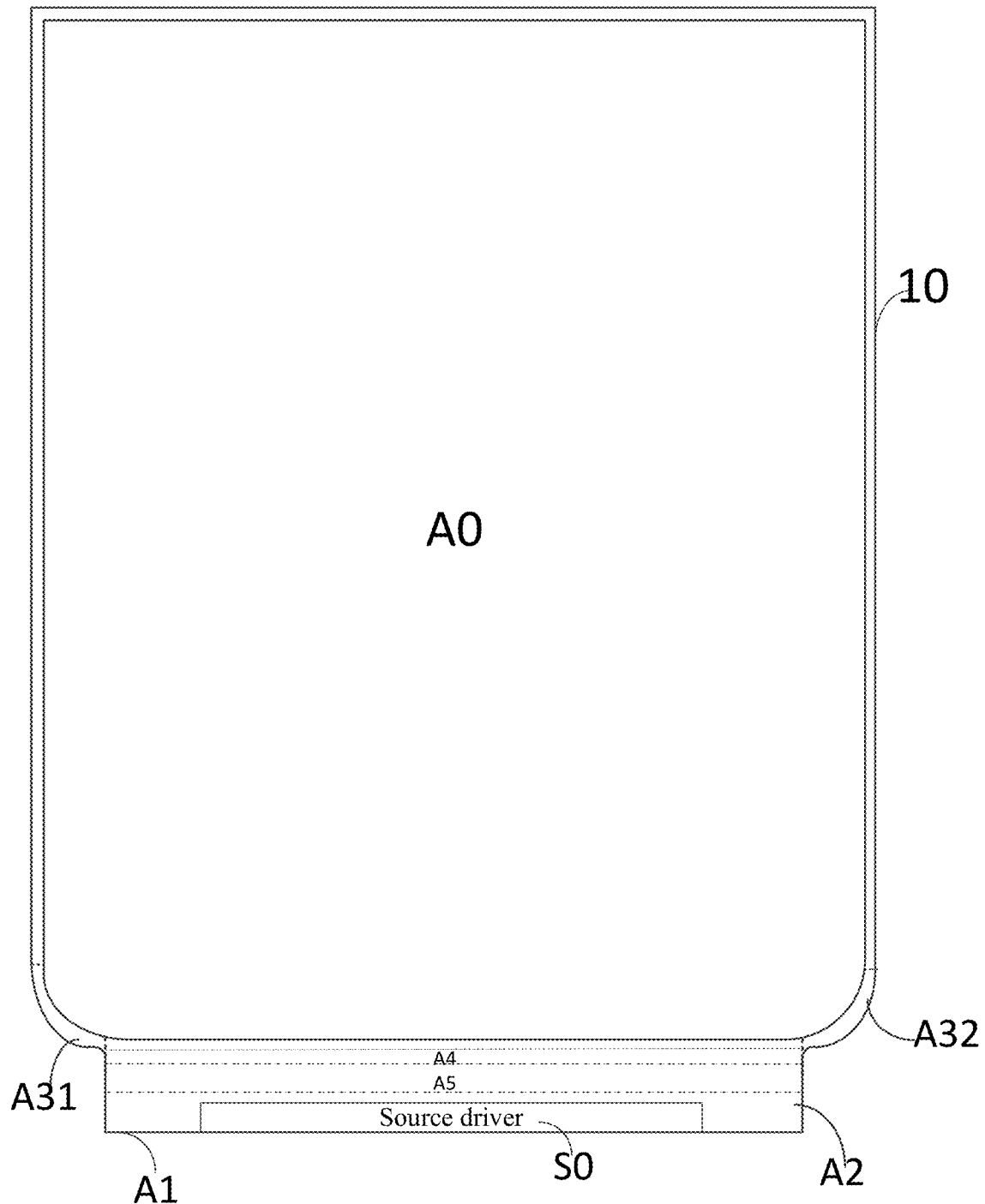
FIG. 1B is a schematic diagram of a display substrate according to at least one embodiment of the present disclosure.

In at least one embodiment of the display substrate shown in FIG. 1B, the first region A2 may comprise a bending area A4 and a fan-out area A5.

In at least one embodiment of the display substrate shown in FIG. 1B, the source driver S0 may be attached to the first frame region, and the source driver S0 respectively supplies corresponding data voltages for data signal leads provided in the first frame region A1.

Figure 2:
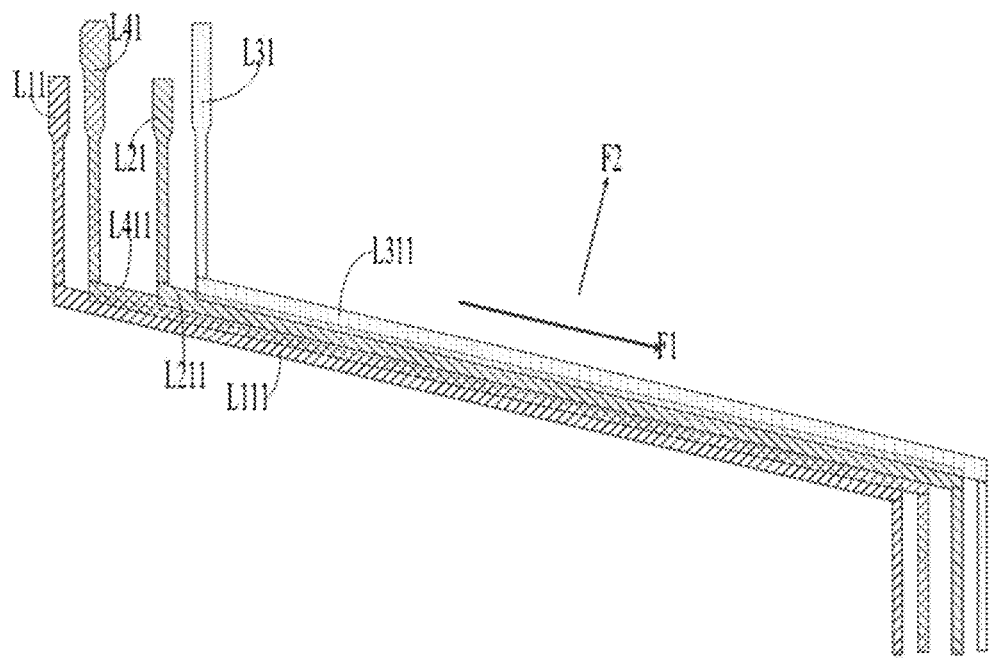
FIG. 2 is a schematic diagram of four adjacent data signal leads disposed in the first region A2 comprised in the display substrate according to at least one embodiment of the present disclosure.

As shown in FIG. 2, four adjacent data signal leads provided in the first region A2 are respectively: a first first data signal lead L11, a first second data signal lead L21, a first third data signal lead L31, and a first fourth data signal lead L41, wherein
  the first first data signal lead L11 comprises a first first lead portion L111 extending in a first direction;
  the first second data signal lead L21 comprises a first second lead portion L211 extending in the first direction;
  the first third data signal lead L31 comprises a first third lead portion L311 extending in the first direction; and
  the first fourth data signal lead L41 comprises a first fourth lead portion L411 extending in the first direction.

Figure 9:
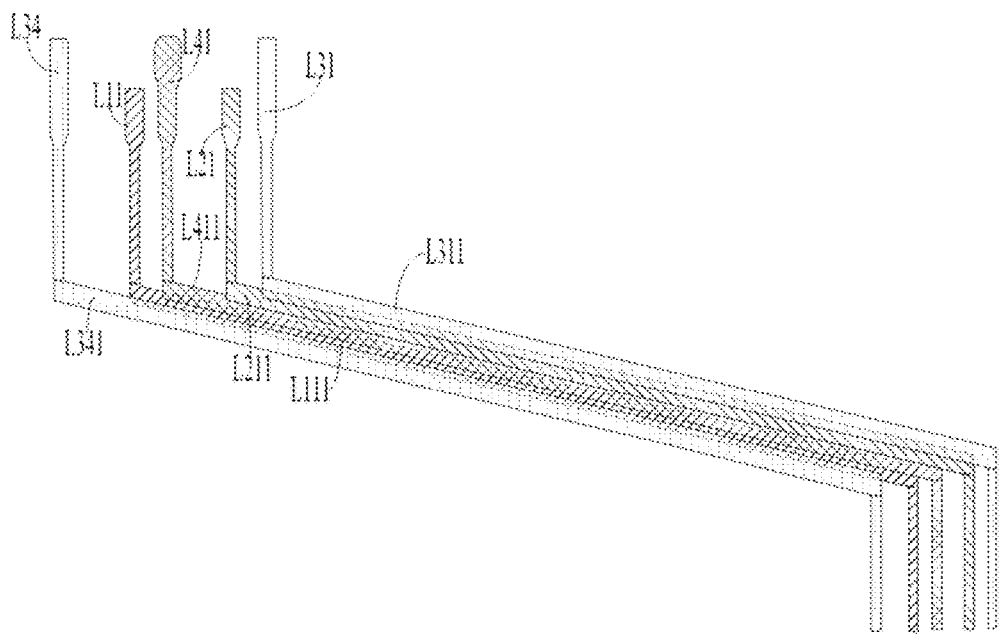
FIG. 9 is a schematic diagram of five adjacent data signal leads disposed in the first region A2 comprised in the display substrate according to at least one embodiment of the present disclosure.

As shown in FIG. 9, a fourth third data signal lead L34 added based on FIG. 2 comprises a fourth third lead portion L341 extending in the first direction.

Figure 3:
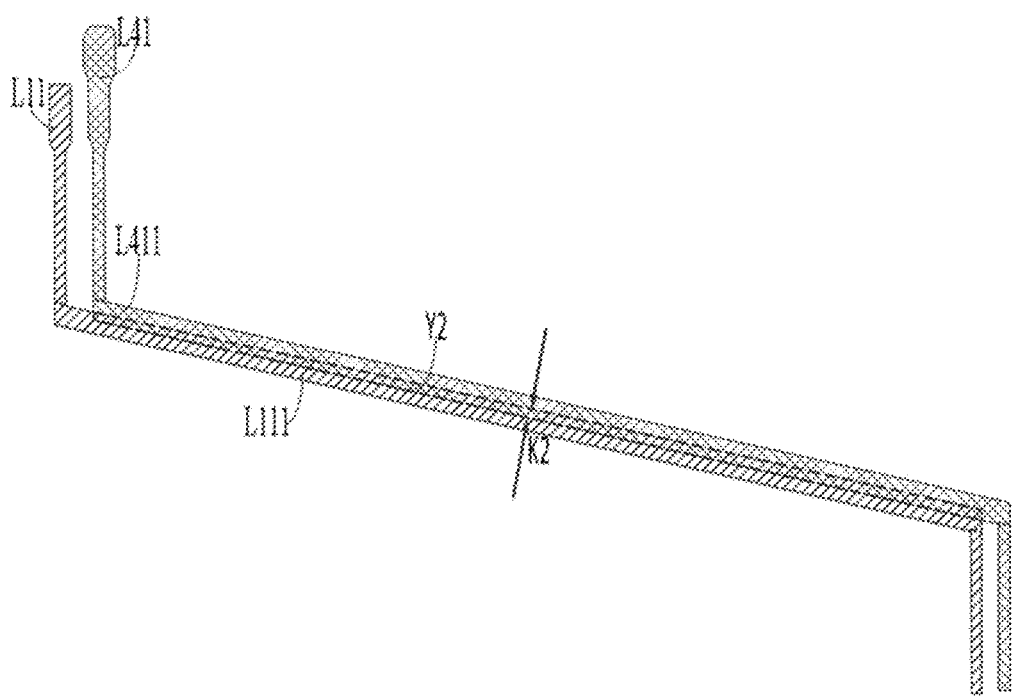
FIG. 3 is a schematic diagram of the positional relationship between the first first data signal lead L11 and the first second data signal lead L41 in FIG. 2.
Figure 4:
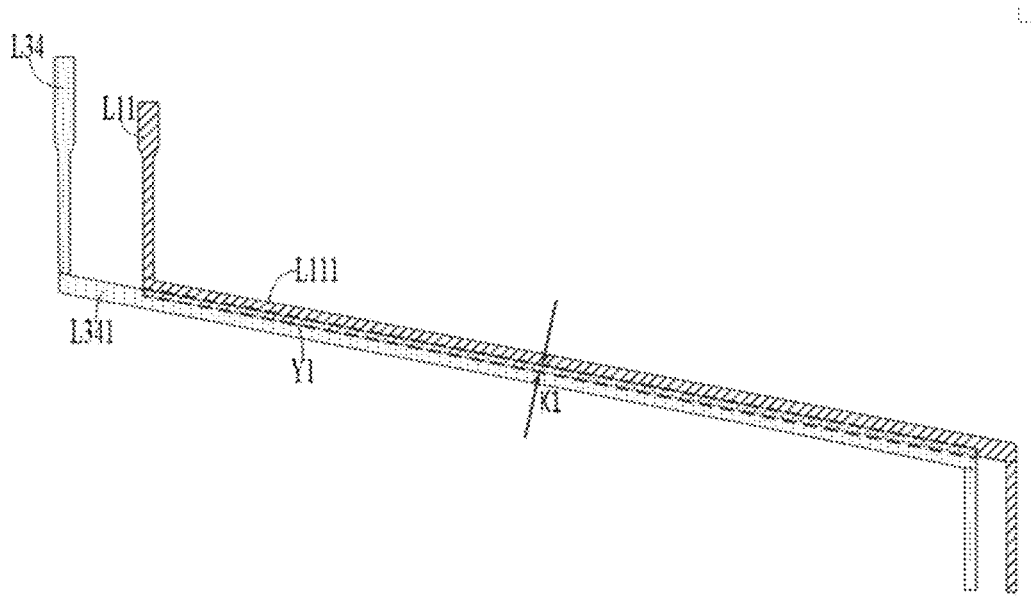
FIG. 4 is a schematic diagram of the positional relationship between the first first data signal lead L11 and the fourth third data signal lead L34 in FIG. 2.
Figure 5:
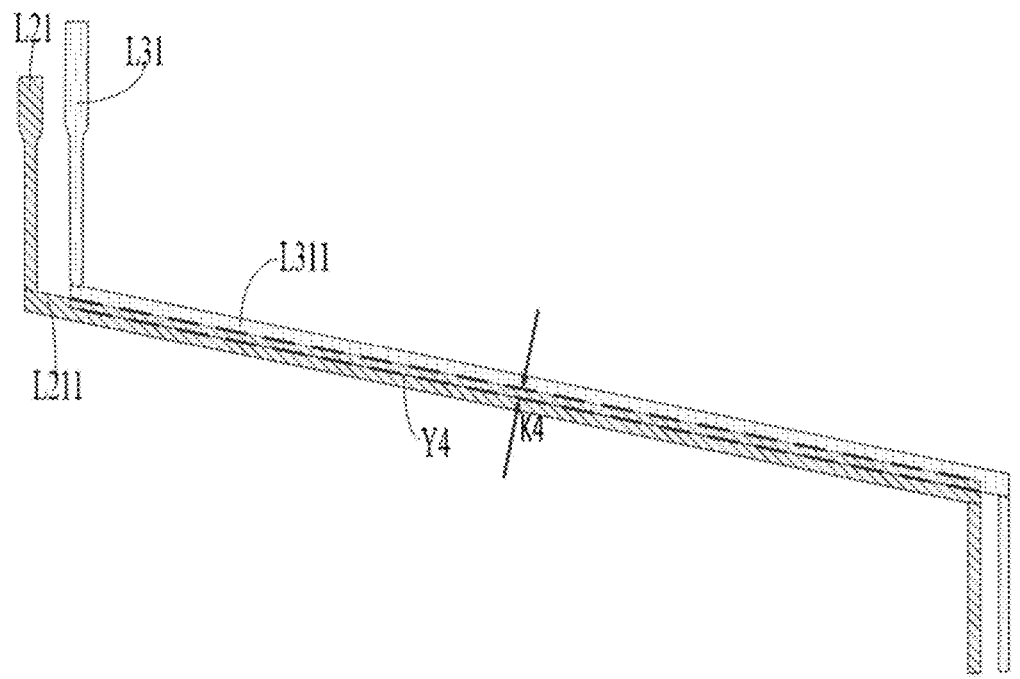
FIG. 5 is a schematic diagram of the positional relationship between the first second data signal lead L21 and the first third data signal lead L31 in FIG. 2.
Figure 6:
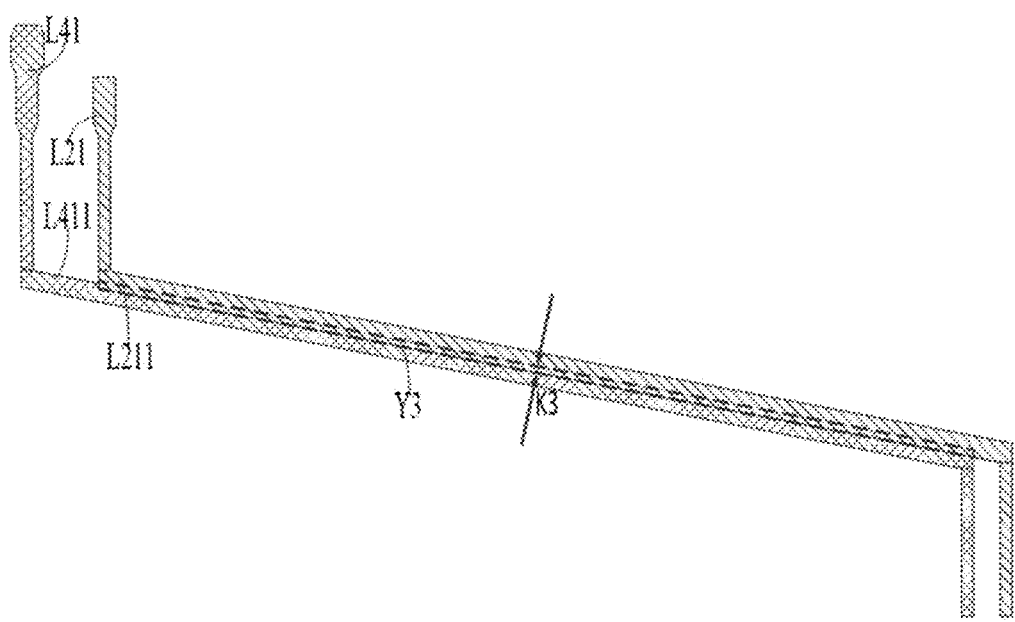
FIG. 6 is a schematic diagram of the positional relationship between the first second data signal lead L21 and the first fourth data signal lead L41 in FIG. 2.
Figure 7:
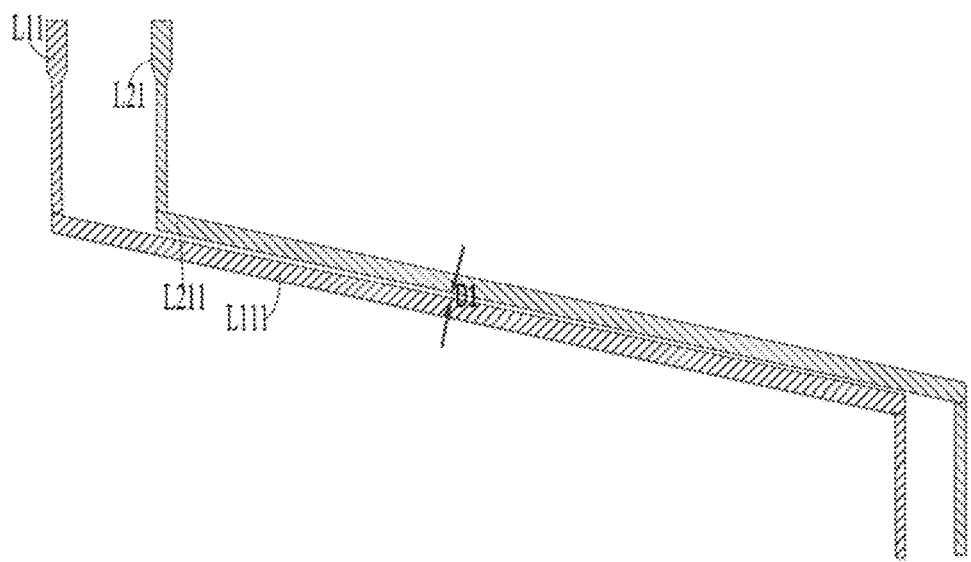
FIG. 7 is a schematic diagram of the positional relationship between the first first data signal lead L11 and the first second data signal lead L21 in FIG. 2.
Figure 8:
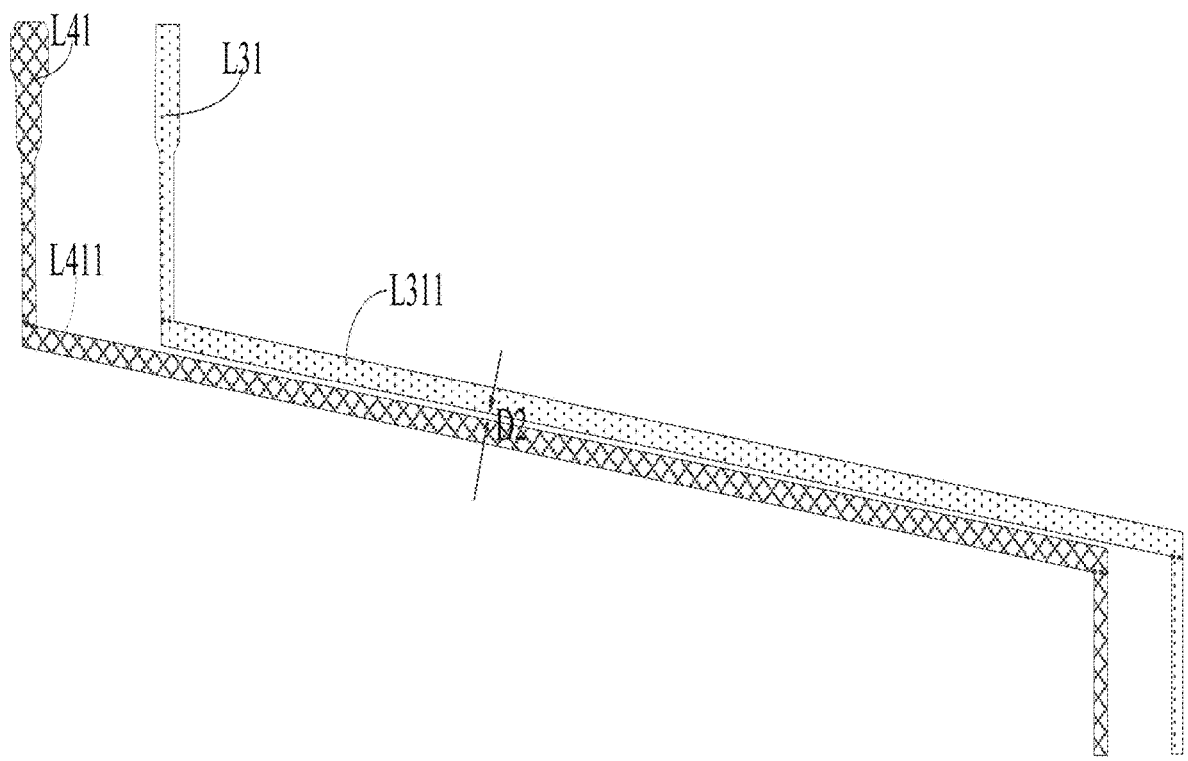
FIG. 8 is a schematic diagram of the positional relationship between the first third data signal lead L31 and the first fourth data signal lead L41 in FIG. 2.

As shown in FIG. 3, the region where the orthographic projection of L111 on the base substrate overlaps with the orthographic projection of L411 on the base substrate is a second overlapping region Y2;
  as shown in FIG. 4, the region where the orthographic projection of L111 on the base substrate overlaps with the orthographic projection of L341 on the base substrate is a first overlapping region Y1;
  as shown in FIG. 5, the region where the orthographic projection of L211 on the base substrate overlaps with the orthographic projection of L311 on the base substrate is a fourth overlapping region Y4;
  as shown in FIG. 6, the region where the orthographic projection of L211 on the base substrate overlaps with the orthographic projection of L411 on the base substrate is a third overlapping region Y3;
  as shown in FIG. 7, the orthographic projection of L111 on the base substrate does not overlap with the orthographic projection of L211 on the base substrate; the distance in the second direction between the orthographic projection of L111 on the base substrate and the orthographic projection of L211 on the base substrate is a first distance D1, wherein the first distance D1 is within a first distance range;
  as shown in FIG. 8, the orthographic projection of L311 on the base substrate does not overlap with the orthographic projection of L411 on the base substrate; and the distance in the second direction between the orthographic projection of L311 on the base substrate and the orthographic projection of L411 on the base substrate is a second distance D2, wherein the second distance D2 is within a second distance range; and
  in at least one embodiment of FIG. 2, the first direction F1 is perpendicular to the second direction F2, but is not limited thereto.

As shown in FIG. 3, the maximum width of the second overlapping region Y2 in the second direction is a second width K2.

As shown in FIG. 4, the maximum width of the first overlapping region Y1 in the second direction is a first width K1.

As shown in FIG. 5, the maximum width of the fourth overlapping region Y4 in the second direction is a fourth width K4.

As shown in FIG. 6, the maximum width of the third overlapping region Y3 in the second direction is a third width K3.

Figure 10:
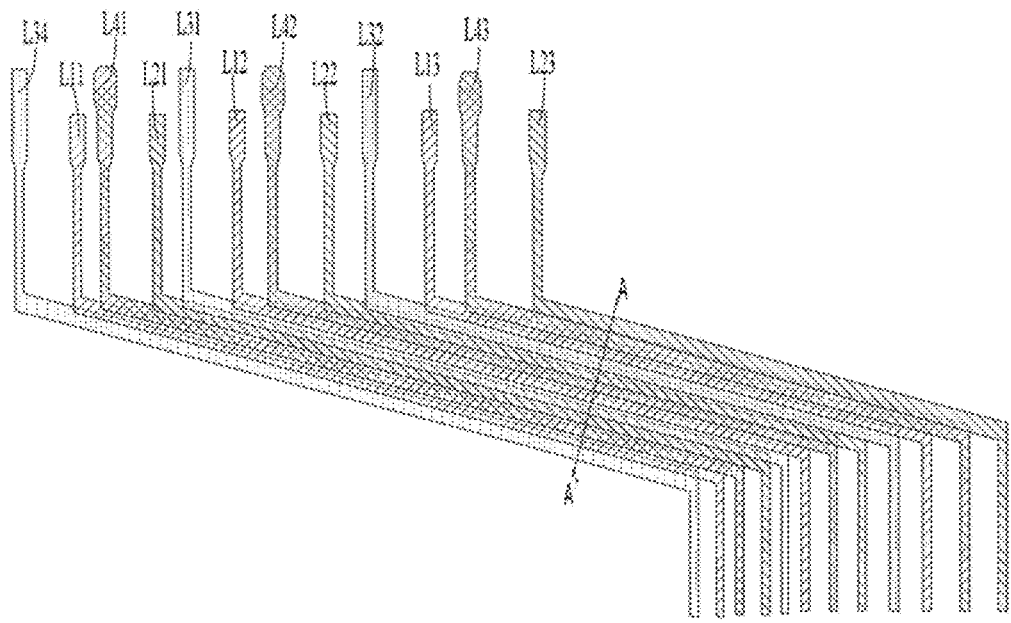
FIG. 10 is a schematic diagram of a plurality of adjacent data signal leads disposed in the first region A2 comprised in the display substrate according to at least one embodiment of the present disclosure.

As shown in FIG. 10, a second first data signal lead L12, a second fourth data signal lead L42, a second second data signal lead L22, a second third data signal lead L32, a third first data signal lead L13, a third fourth data signal lead L43, and a third second data signal lead L23 arranged from left to right are added based on FIG. 9.

In at least one embodiment of the present disclosure, each data signal lead may comprise a lead portion having a line width of 2 um, the shortest distance between a first lead portion comprised in the first data signal lead and a second lead portion comprised in the second data signal lead may be 0.4 um, the shortest distance between a third lead portion comprised in the third data signal lead and a fourth lead portion comprised in the fourth data signal lead may be 0.4 um, the fourth width may be 0.4 um, and the third width may be 1.2 um, but is not limited thereto.

Figure 11:
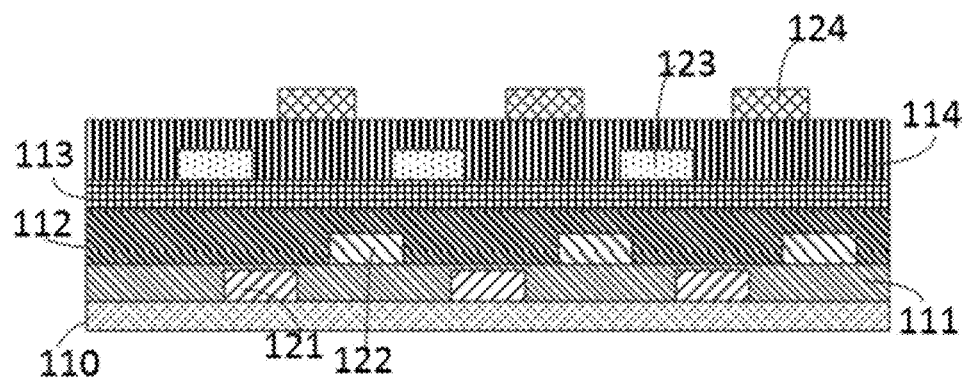
FIG. 11 is a cross-sectional diagram of A-A' in FIG. 10.

FIG. 11 is a cross-sectional diagram of A-A' in FIG. 10, wherein the A-A' direction may be a direction perpendicular to the first direction.

In FIG. 11, reference numeral 110 denotes a fifth insulating layer, reference numeral 121 denotes a first gate metal layer, reference numeral 111 denotes a first insulating layer, reference numeral 122 denotes a second gate metal layer, reference numeral 112 denotes a second insulating layer, reference numeral 113 denotes a third insulating layer, reference numeral 123 denotes a first source and drain metal layer, reference numeral 114 denotes a fourth insulating layer, and reference numeral 124 denotes a metal wiring layer.

In at least one embodiment shown in FIG. 11, the base substrate may be provided on a side of the fifth insulating layer 110 away from the first gate metal layer 121.

Optionally, the display substrate according to at least one embodiment of the present disclosure further comprises a plurality of power lines arranged in the display region, wherein
  the power lines are arranged on the same layer as the third data signal leads.

In an embodiment, the power line and the third data signal lead may both be comprised in the first source and drain metal layer, the power line is configured for transmitting a power supply signal having a stable potential.

In at least one embodiment of the present disclosure, the display substrate further comprises a second source and drain metal layer, wherein the second source and drain metal layer is arranged on a side of the metal wiring layer away from the first source and drain metal layer;
  the second source and drain metal layer comprises the data lines.

Figure 12:
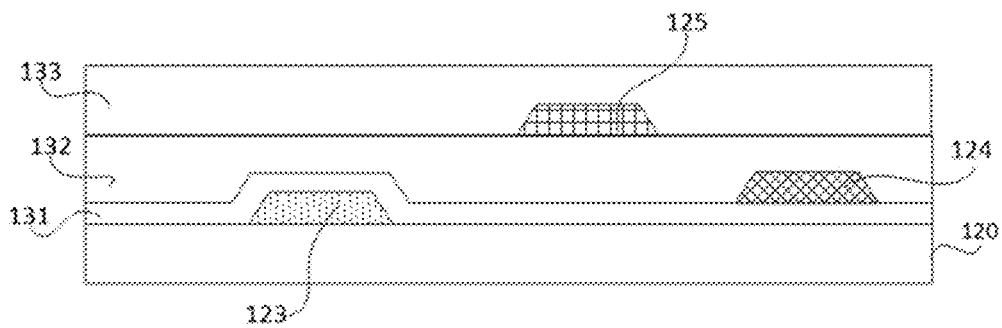
FIG. 12 is a cross-sectional diagram of a display substrate according to at least one embodiment of the present disclosure.

As shown in FIG. 12, in at least one embodiment of the present disclosure, the display substrate may comprise a first source and drain metal layer 123, a passivated layer 131, a metal wiring layer 124, a first flat layer 132, a second source and drain metal layer 125, and a second flat layer 133 which are stacked in sequence in a direction away from the base substrate;

FIG. 12 also illustrates a lower film layer 120 located below the passivated layer 131.

In at least one embodiment of the present disclosure, a metal wiring layer is added in the display substrate for laying out the third data signal lead and the power line. As shown in FIG. 12, in at least one embodiment of the present disclosure, the metal wiring layer 124 may be placed between the passivated layer 131 and the first flat layer 132, enabling good avoidance of shorting between the metal wiring layer and other adjacent conductive film layers without adding additional insulating layers. Therefore, the introduction of the metal wiring layer required to achieve the introduction of the metal wiring layer in the display substrate, and the reliability of the conductive structure manufactured by the metal wiring layer is ensured, thereby effectively saving the manufacturing cost of the display substrate.

Illustratively, the data lines may be comprised in the second source and drain metal layer and the display substrate may comprise power lines comprised in the metal wiring layer.

Figure 13:
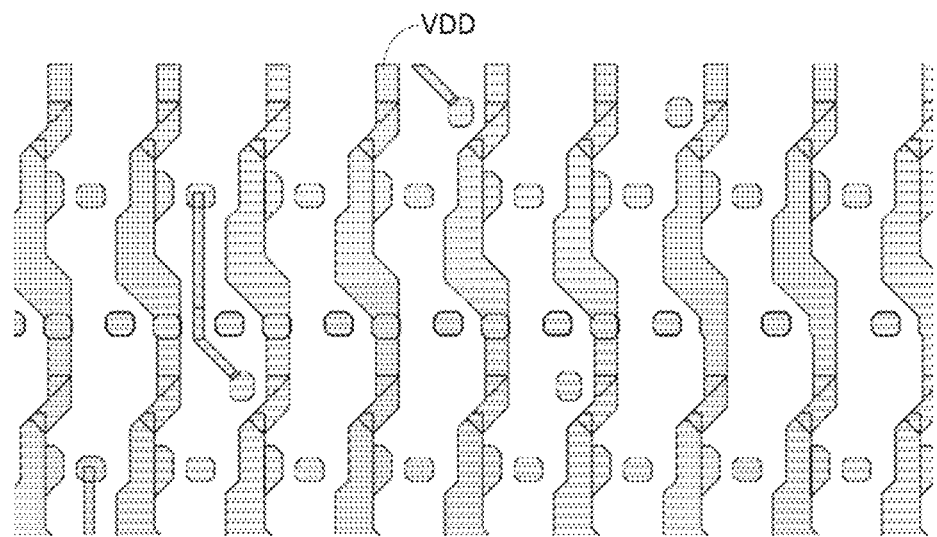
FIG. 13 is a schematic diagram of a layout of at least one embodiment of a metal wiring layer in a display region.

FIG. 13 is a schematic diagram of a layout of at least one embodiment of a metal wiring layer in a display region. In FIG. 13, reference numeral VDD denotes a power line.

Figure 14:
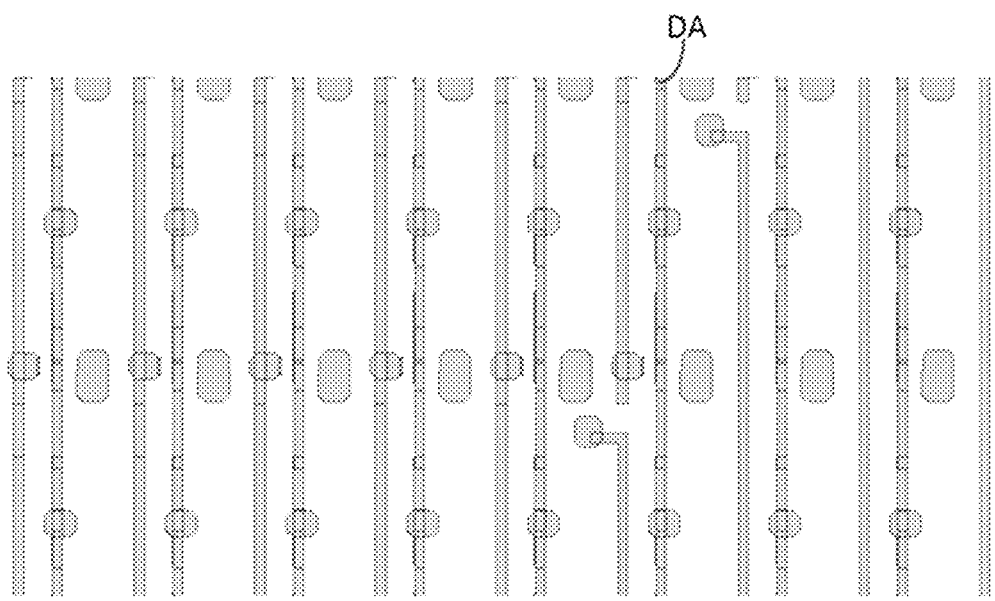
FIG. 14 is a schematic diagram of a layout of at least one embodiment of a second source and drain metal layer in a display region.

FIG. 14 is a schematic diagram of a layout of at least one embodiment of a second source and drain metal layer in a display region. In FIG. 14, reference numeral DA denotes a data line.

Figure 15:
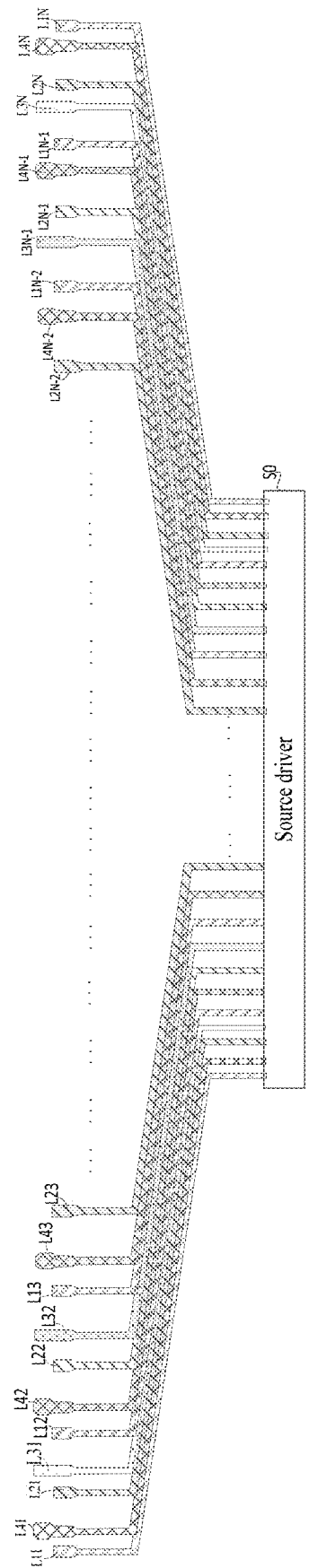
FIG. 15 is a schematic diagram of the connection relationship between a plurality of data signal leads disposed in the first region and a source driver S0 in a display substrate according to at least one embodiment of the present disclosure.

As shown in FIG. 15, the source driver S0 is respectively electrically connected to a first first data signal lead L11, a first fourth data signal lead L41, a first second data signal lead L21, a first third data signal lead L31, a second first data signal lead L12, a second fourth data signal lead L42, a second second data signal lead L22, a second third data signal lead L32, a third first data signal lead L13, a third fourth data signal lead L43, a third second data signal lead L23, an (N−2)th first data signal lead L1N−2, an (N−2)th fourth data signal lead L4N−2, an (N−2)th second data signal lead L2N−2, an (N−1)th first data signal lead L1N−1, an (N−1)th fourth data signal lead L4N−1, an (N−1)th second data signal lead L2N−1, an (N−1)th third data signal lead L3N−1, an Nth first data signal lead L1N, an Nth fourth data signal lead L4N, an Nth second data signal lead L2N, and an Nth third data signal lead L3N arranged in the first region, for respectively supplying corresponding data voltages to the above data signal leads;

as shown in FIG. 15, a first first data signal lead L11, a first fourth data signal lead L41, a first second data signal lead L21, a first third data signal lead L31, a second first data signal lead L12, a second fourth data signal lead L42, a second second data signal lead L22, a second third data signal lead L32, a third first data signal lead L13, a third fourth data signal lead L43, a third second data signal lead L23, an (N−2)th first data signal lead L1N−2, an (N−2)th fourth data signal lead L4N−2, an (N−2)th second data signal lead L2N−2, an (N−1)th first data signal lead L1N−1, an (N−1)th fourth data signal lead L4N−1, an (N−1)th second data signal lead L2N−1, an (N−1)th third data signal lead L3N−1, an Nth first data signal lead L1N, an Nth fourth data signal lead L4N, an Nth second data signal lead L2N, and an Nth third data signal lead L3N are sequentially arranged from bottom to top, wherein N is an integer greater than 4.

In at least one embodiment shown in FIG. 15, the relative positional relationship of the data signal leads is arranged from bottom to top. When the source and drain metal layers are arranged on the lower side of the display substrate, each data signal lead can be arranged from left to right in sequence.

Figure 16:
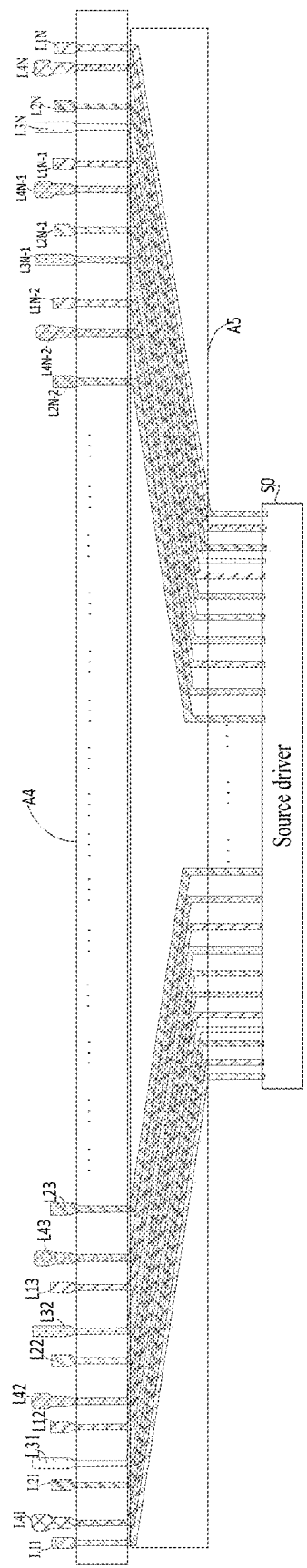
FIG. 16 is a schematic diagram of adding indications for a bending area A4 and a fan-out area A5 based on FIG. 15.
Figure 17:
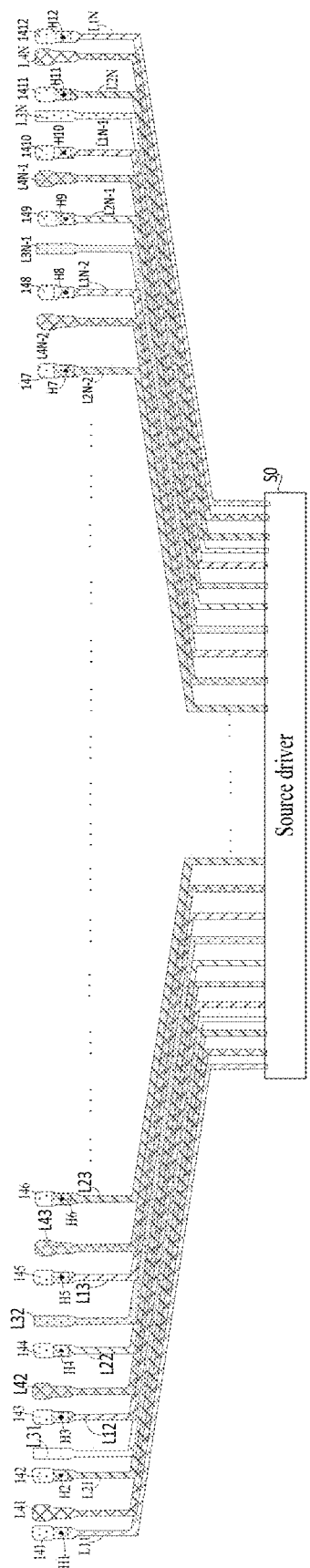
FIG. 17 is a schematic diagram of adding a plurality of adapters and a plurality of vias based on FIG. 15.

FIG. 16 differs from FIG. 17 in that indications of bending area A4 and fan-out area A5 are added.

As shown in FIG. 16, a lead portion extending in the first direction comprised in each of the data signal leads may be disposed at least partially within the fan-out area A5.

FIG. 17 is a schematic diagram of adding a plurality of adapters and a plurality of vias based on FIG. 15.

As shown in FIG. 17, reference numeral 141 denotes a first adapter and reference numeral H1 denotes a first via; reference numeral 142 denotes a second adapter and reference numeral H2 denotes a second via; reference numeral 143 denotes a third adapter and reference numeral H3 denotes a third via; reference numeral 144 denotes a fourth adapter and reference numeral H4 denotes a fourth via; reference numeral 145 denotes a fifth adapter and reference numeral H5 denotes a fifth via; reference numeral 146 denotes a sixth adapter and reference numeral H1 denotes a sixth via; reference numeral 147 denotes a seventh adapter and reference numeral H7 denotes a seventh via; reference numeral 148 denotes an eighth adapter and reference numeral H8 denotes an eighth via; reference numeral 149 denotes a ninth adapter and reference numeral H9 denotes a ninth via; reference numeral 1410 denotes a tenth adapter and reference numeral H10 denotes a tenth via; reference numeral 1411 denotes an eleventh adapter and reference numeral H11 denotes an eleventh via; and reference numeral 1412 denotes a twelfth adapter and reference numeral H12 denotes a twelfth via.

L11 is coupled to the first adapter 141 through the first via H1, the first adapter 141 is coupled to a first first data line through a corresponding via, the first adapter 141 is comprised in the first source and drain metal layer, and the first first data line is comprised in the second source and drain metal layer;

L21 is coupled to the second adapter 142 through the second via H2, the second adapter 142 is coupled to a first second data line through a corresponding via, the second adapter 142 is comprised in the first source and drain metal layer, and the first second data line is comprised in the second source and drain metal layer;

L12 is coupled to the third adapter 143 through the third via H3, the third adapter 143 is coupled to a second first data line through a corresponding via, the third adapter 143 is comprised in the first source and drain metal layer, and the second first data line is comprised in the second source and drain metal layer;

L22 is coupled to the fourth adapter 144 through the fourth via H4, the fourth adapter 144 is coupled to a second second data line through a corresponding via, the fourth adapter 144 is comprised in the first source and drain metal layer, and the second second data line is comprised in the second source and drain metal layer;

L13 is coupled to the fifth adapter 145 through the fifth via H5, the fifth adapter 145 is coupled to a third first data line through a corresponding via, the fifth adapter 145 is comprised in the first source and drain metal layer, and the third first data line is comprised in the second source and drain metal layer;

L23 is coupled to the sixth adapter 146 through the sixth via H6, the sixth adapter 146 is coupled to a third second data line through a corresponding via hole, the sixth adapter 146 is comprised in the first source and drain metal layer, and the third second data line is comprised in the second source and drain metal layer;

L2N−2 is coupled to the seventh adapter 147 through the seventh via H7, the seventh adapter 147 is coupled to an (N−2)th second data line through a corresponding via hole, the seventh adapter 147 is comprised in the first source and drain metal layer, and the (N−2)th second data line is comprised in the second source and drain metal layer;

L1N−2 is coupled to the eighth adapter 148 through the eighth via H8, the eighth adapter 148 is electrically connected to an (N−2)th first data line through a corresponding via, the eighth adapter 148 is comprised in the first source and drain metal layer, and the (N−2)th first data line is comprised in the second source and drain metal layer;

L2N−1 is coupled to the ninth adapter 149 through the ninth via H9, the ninth adapter 149 is coupled to an (N−1)th second data line through a corresponding via, the ninth adapter 149 is comprised in the first source and drain metal layer, and the (N−1)th second data line is comprised in the second source and drain metal layer;

L1N−1 is coupled to the tenth adapter 1410 through the tenth via H10, the tenth adapter 1410 is coupled to an (N−1)th first data line through a corresponding via, the tenth adapter 1410 is comprised in the first source and drain metal layer, and the (N−1)th first data line is comprised in the second source and drain metal layer;

L2N is coupled to the eleventh adapter 1411 through the eleventh via H11, the eleventh adapter 1411 is electrically connected to an Nth second data line through a corresponding via, the eleventh adapter 1411 is comprised in the first source and drain metal layer, and the Nth second data line is comprised in the second source and drain metal layer; and L1N is coupled to the twelfth adapter 1412 through the twelfth via H12, the twelfth adapter 1412 is electrically connected to an Nth first data line through a corresponding via, the twelfth adapter 1412 is comprised in the first source and drain metal layer, and the Nth first data line is comprised in the second source and drain metal layer.

As shown in FIG. 17, each first data signal lead is comprised in the first gate metal layer, each second data signal lead is comprised in the second gate metal layer, and each data line is comprised in the second source and drain metal layer; each first data signal lead is coupled to a corresponding data line comprised in the second source and drain metal layer through a corresponding via and a corresponding adapter arranged in the first region and each second data signal lead is coupled to a corresponding data line comprised in the second source and drain metal layer through a corresponding via and a corresponding adapter arranged in the first region; each third data signal lead is comprised in the first source and drain metal layer and each third data signal lead can be electrically connected to a corresponding data line contained in the second source and drain metal layer through a corresponding via; and each of the fourth data signal lead is comprised in the metal wiring layer and may be coupled to a corresponding data line comprised in the second source and drain metal layer through a corresponding via.

Figure 18:
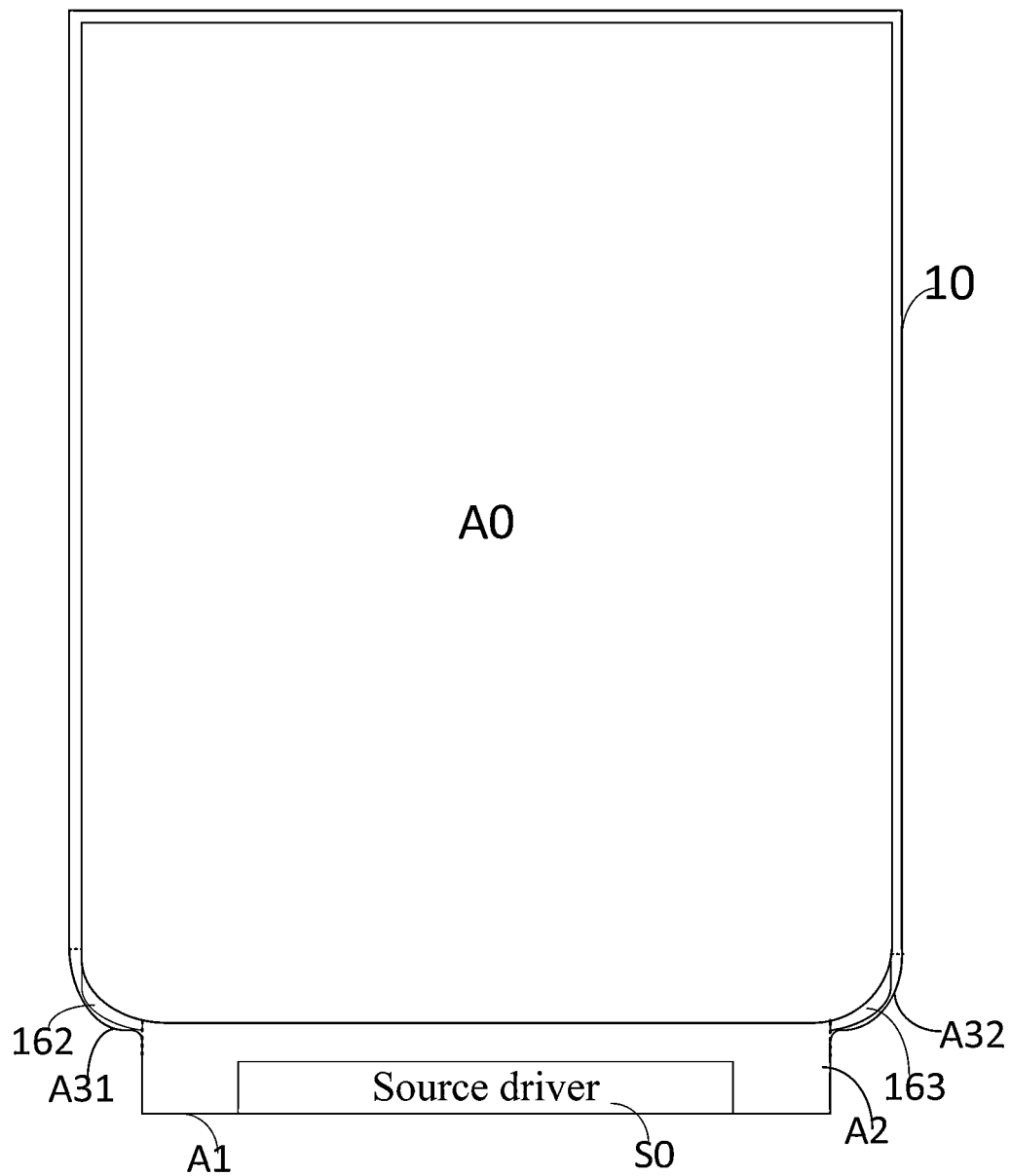
FIG. 18 is a schematic diagram of a display substrate according to at least one embodiment of the present disclosure.

As shown in FIG. 18, on the basis of at least one embodiment of the display substrate shown in FIG. 1A, a second data signal lead set 162 is provided in the first rounded corner region A31, and a third data signal lead set 163 is provided in the second rounded corner region A32;

the data signal leads comprised in the second data signal lead set 162 may be symmetrically disposed with the data signal leads comprised in the third data signal lead set, but is not limited thereto.

In actual operation, each data signal lead comprised in the second data signal lead set 162 is electrically connected to the source driver S0 respectively through a connecting line provided in the first region A2 to receive a data voltage from the source driver S0; each data signal lead comprised in the third data signal lead set 163 is electrically connected to the source driver S0 respectively through a connection line provided at the first region A2 to receive a data voltage from the source driver S0.

Figure 19:
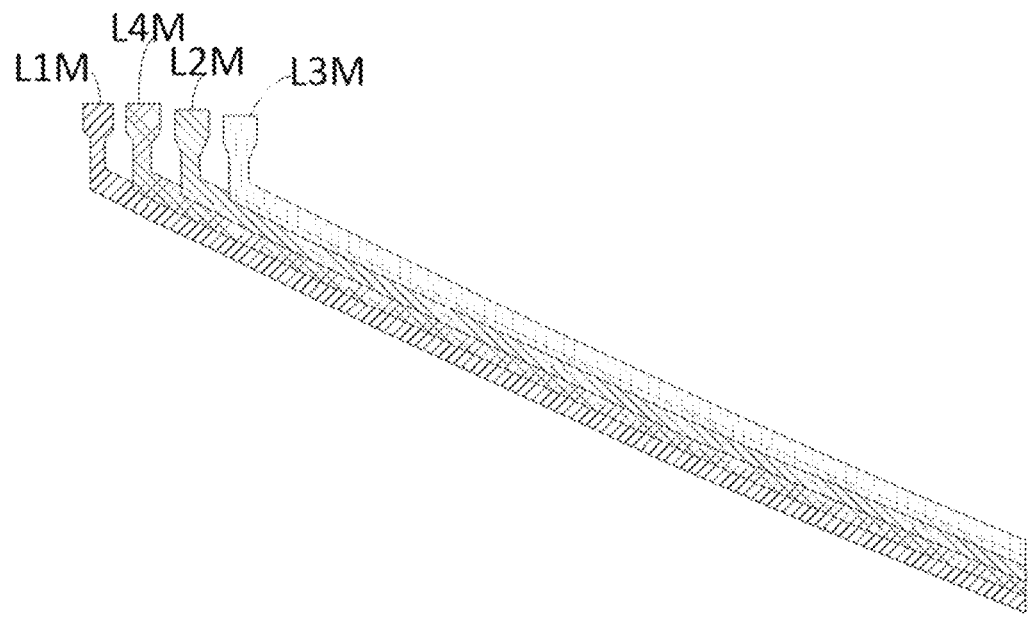
FIG. 19 is a schematic diagram of four data signal leads disposed in a first rounded corner region comprised in a display substrate according to at least one embodiment of the present disclosure.

FIG. 19 is a stack diagram of four data signal leads comprised in the second data signal lead set 162. In FIG. 19, reference numeral L1M denotes an Mth first data signal lead, reference numeral L2M is an Mth second data signal lead, reference numeral L3M is an Mth third data signal lead, and reference numeral L4M is an Mth fourth data signal lead, wherein M is an integer greater than N.

In at least one embodiment of the present disclosure, the frame region comprises the first region, a first rounded corner region provided on a first side of the first region, and a second rounded corner region provided on a second side of the first region, wherein the first side and the second side are opposite to each other;

in the first and the second rounded corner regions, the region where the orthographic projection of the first data signal leads on the base substrate overlaps with the orthographic projection of the third data signal leads on the base substrate is a fifth overlapping region, an edge of the fifth overlapping region comprises a first side edge and a second side edge which are arranged opposite to each other, and the lengths of the first side edge and the second side edge are both greater than the lengths of the other side edges of the edge of the fifth overlapping region, the longest distance in a third direction between a point on the first side edge and the second side edge is within a third distance range, and the third direction intersects a direction in which a tangent to the first side edge extends at the point;

in the first and the second rounded corner regions, the region where the orthographic projection of the first data signal leads on the base substrate overlaps with the orthographic projection of the fourth data signal leads on the base substrate is a sixth overlapping region, the sixth overlapping region comprises a third side edge and a fourth side edge which are arranged opposite to each other, and the lengths of the third side edge and the fourth side edge are both greater than the lengths of the other side edges of the edge of the sixth overlapping region, the longest distance in a fourth direction between a point on the third side edge and the fourth side edge is within a fourth distance range, and the fourth direction intersects a direction in which a tangent to the third side edge extends at the point; and in the first and the second rounded corner regions, the region where the orthographic projection of the second data signal leads on the base substrate overlaps with the orthographic projection of the fourth data signal leads on the base substrate is a seventh overlapping region, the seventh overlapping region comprises a fifth side edge and a sixth side edge which are arranged opposite to each other, and the lengths of the fifth side edge and the sixth side edge are both greater than the lengths of the other side edges of the edge of the seventh overlapping region, the longest distance in a fifth direction between a point on the fifth side edge and the sixth side edge is within a fifth distance range, and the fifth direction intersects a direction in which a tangent to the fifth side edge extends at the point.

In at least one embodiment of the present disclosure, the longest distance in a third direction between a point on the first side edge and the second side edge may be: the longest distance in the third direction between all points on the first side edge and the second side edge, respectively;

the longest distance in a fourth direction between a point on the third side edge and the fourth side edge may be: the longest distance in the fourth direction between all points on the third side edge and the fourth side edge, respectively;

the longest distance in a fifth direction between a point on the fifth side edge and the sixth side edge may be: the longest distance in the fifth direction between all points on the fifth side edge and the sixth side edge, respectively;

but is not limited thereto.

Optionally, the third distance range is greater than or equal to 0.2 um and less than or equal to 0.4 um, the fourth distance range is greater than or equal to 0.2 um and less than or equal to 0.5 um, and the fifth distance range is greater than or equal to 0.7 um and less than or equal to 1.6 um.

In at least one embodiment of the present disclosure, the first side may be a left side and the second side may be a right side, but is not limited thereto.

Figure 20:
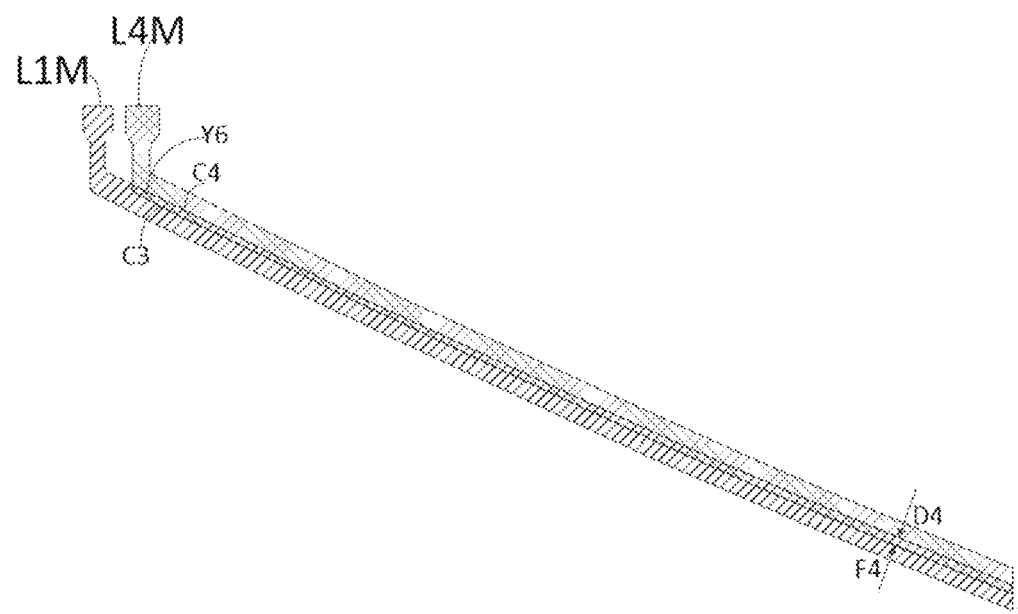
FIG. 20 is a schematic diagram of the positional relationship between the Mth first data signal lead L1M and the Mth fourth data signal lead L4M in FIG. 19.

As shown in FIG. 20, the overlapping region between the orthographic projection of the Mth first data signal lead L1M on the base substrate and the orthographic projection of the Mth fourth data signal lead L4M on the base substrate is a sixth overlapping region Y6;

the edge of the sixth overlapping region Y6 comprises a third side edge C3 and a fourth side edge C4 which are oppositely arranged, the length of the third side edge C3 and the length of the fourth side edge C4 are both greater than the length of the other sides of the edge of the sixth overlapping region Y6;

the longest distance in the fourth direction F4 between a point on the third side edge C3 and the fourth side edge C4 is a fourth distance D4; and the fourth distance D4 is within the fourth distance range.

In at least one embodiment shown in FIG. 20, the third side edge C3 may comprise a plurality of interconnected line segments (the extension directions of the plurality of interconnected line segments are substantially the same), then the extension direction of a tangent to a point on the third side edge C3 is the same as the extension direction of the line segment on which the point is located, and the fourth direction F4 may be perpendicular to the extension direction, but is not limited thereto.

In at least one embodiment shown in FIG. 20, the fourth directions F4 corresponding to different points on the third side edge C3 may differ from each other and only one point on the third side edge C3 corresponding to the fourth direction F4 is shown in FIG. 20.

In at least one embodiment of the present disclosure, the third side edge C3 and the fourth side edge C4 may also be replaced with arc-shaped side edges.

Figure 21:
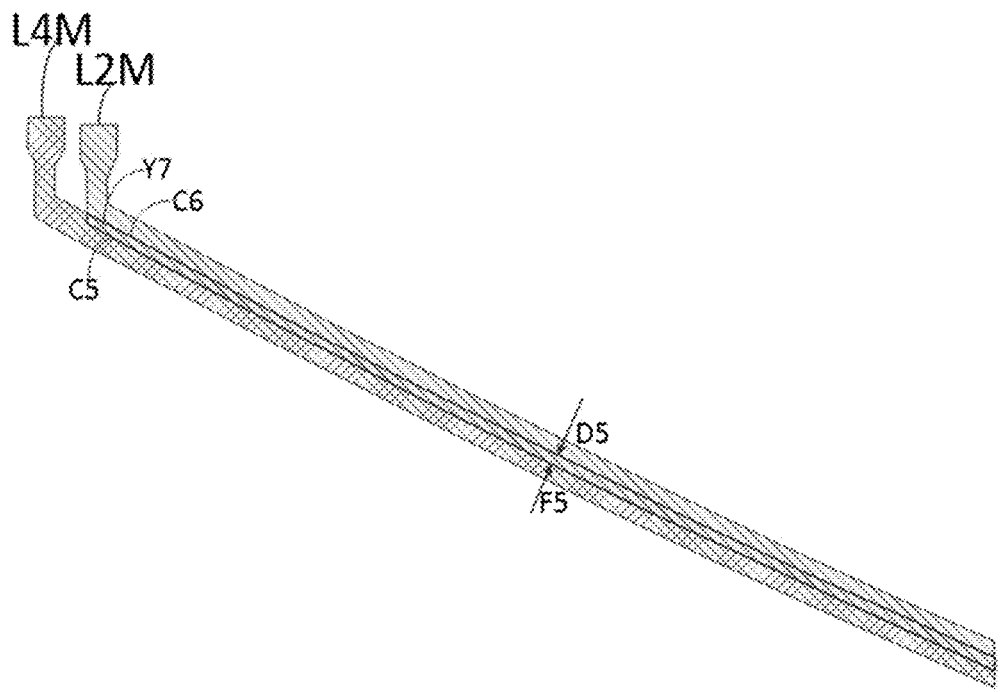
FIG. 21 is a schematic diagram of the positional relationship between the Mth second data signal lead L2M and the Mth fourth data signal lead L4M in FIG. 19.

As shown in FIG. 21, the overlapping region between the orthographic projection of the Mth second data signal lead L2M on the base substrate and the orthographic projection of the Mth fourth data signal lead L4M on the base substrate is a seventh overlapping region Y7;

the edge of the seventh overlapping region Y7 comprises a fifth side edge C5 and a sixth side edge C6 which are oppositely arranged, and the length of the fifth side edge C5 and the length of the sixth side edge C6 are both greater than the length of the other sides of the edge of the seventh overlapping region Y7;

the longest distance in the fifth direction F5 between a point on the fifth side edge C5 and the sixth side edge C6 is a fifth distance D5; and the fifth distance D5 is within the fifth distance range.

In at least one embodiment shown in FIG. 21, the fifth side edge C5 may comprise a plurality of interconnected line segments (the extension directions of the plurality of interconnected line segments are substantially the same), then the extension direction of a tangent to a point on the fifth side edge C5 is the same as the extension direction of the line segment on which the point is located, and the fifth direction F5 may be perpendicular to the extension direction, but is not limited thereto.

In at least one embodiment shown in FIG. 21, the fifth directions F5 corresponding to different points on the fifth side edge C5 may differ from each other and only one point on the fifth side edge C5 corresponding to the fifth direction F5 is shown in FIG. 21.

In at least one embodiment of the present disclosure, the fifth side edge C5 and the sixth side edge C6 may also be replaced with arc-shaped side edges.

In at least one embodiment of the present disclosure, the frame region comprises the first region, a first rounded corner region provided on a first side of the first region, and a second rounded corner region provided on a second side of the first region, wherein the first side and the second side are opposite to each other;

in the first and the second rounded corner regions, the region where the orthographic projection of the second data signal leads on the base substrate overlaps with the orthographic projection of the third data signal leads on the base substrate is a eighth overlapping region, the eighth overlapping region comprises a seventh side edge and an eighth side edge which are arranged opposite to each other, and the lengths of the seventh side edge and the eighth side edge are both greater than the lengths of the other side edges of the edge of the eighth overlapping region, the longest distance in a sixth direction between a point on the seventh side edge and the eighth side edge is within a sixth distance range, and the sixth direction intersects a direction in which a tangent to the seventh side edge extends at the point.

Optionally, the sixth distance range is greater than or equal to 0.1 um and less than or equal to 0.5 um.

Figure 22:
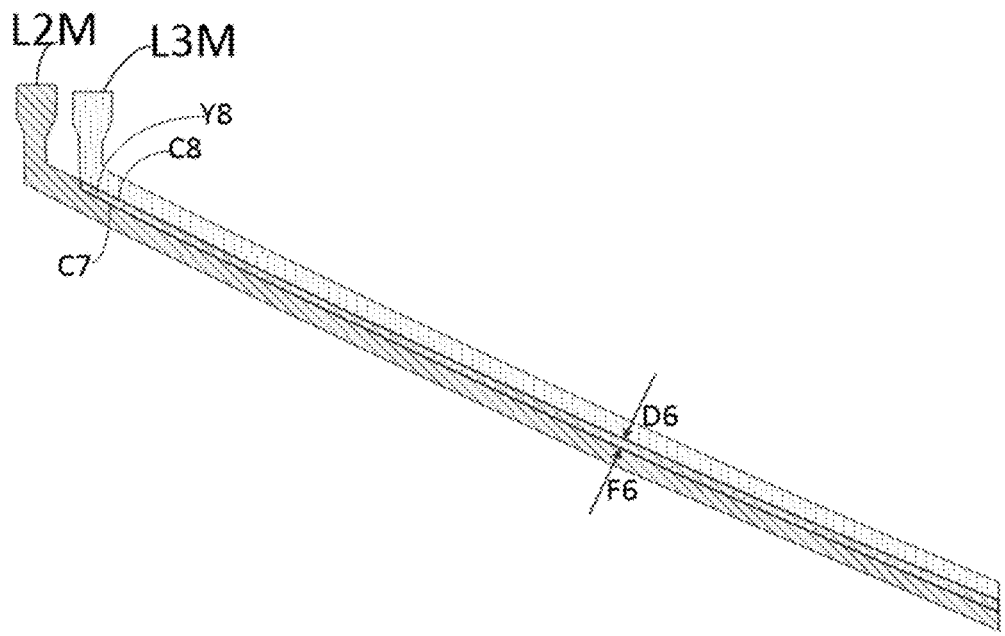
FIG. 22 is a schematic diagram of the positional relationship between the Mth second data signal lead L2M and the Mth third data signal lead L3M in FIG. 19.

In at least one embodiment of the present disclosure, the longest distance in a sixth direction between a point on the seventh side edge and the eighth side edge may be: the longest distance in the sixth direction between all points on the seventh side edge and the eighth side edge, respectively;

as shown in FIG. 22, the overlapping region between the orthographic projection of the Mth second data signal lead L2M on the base substrate and the orthographic projection of the Mth third data signal lead L3M on the base substrate is an eighth overlapping region Y8;

the edge of the eighth overlapping region Y8 comprises a seventh side edge C7 and an eighth side edge C8 which are oppositely arranged, and the length of the seventh side edge C7 and the length of the eighth side edge C8 are both greater than the length of the other sides of the edge of the eighth overlapping region Y8;

the longest distance in the sixth direction F6 between a point on the seventh side edge C7 and the eighth side edge C8 is a sixth distance D6; and the sixth distance D6 is within the sixth distance range.

In at least one embodiment shown in FIG. 22, the seventh side edge C7 may comprise a plurality of interconnected line segments (the extension directions of the plurality of interconnected line segments are substantially the same), then the extension direction of a tangent to a point on the seventh side edge C7 is the same as the extension direction of the line segment on which the point is located, and the sixth direction F6 may be perpendicular to the extension direction, but is not limited thereto.

In at least one embodiment shown in FIG. 22, the sixth directions F6 corresponding to different points on the seventh side edge C7 may differ from each other and only one point on the seventh side edge C7 corresponding to the sixth direction F6 is shown in FIG. 22.

In at least one embodiment of the present disclosure, the seventh side edge C7 and the eighth side edge C8 may also be replaced with arc-shaped side edges.

Figure 23:
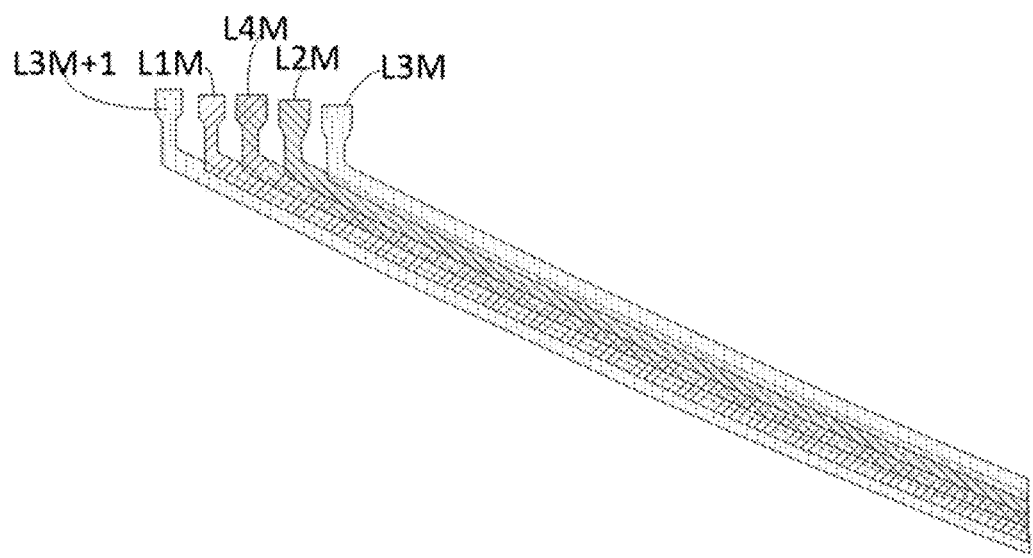
FIG. 23 is a schematic diagram of five data signal leads disposed in a first rounded corner region comprised in a display substrate according to at least one embodiment of the present disclosure.

As shown in FIG. 23, on the basis of FIG. 19, the (M+1)th third data signal lead L3M+1 is added, and the orthographic projection of L3M+1 on the base substrate partially overlaps with the orthographic projection of L1M on the base substrate.

Figure 24:
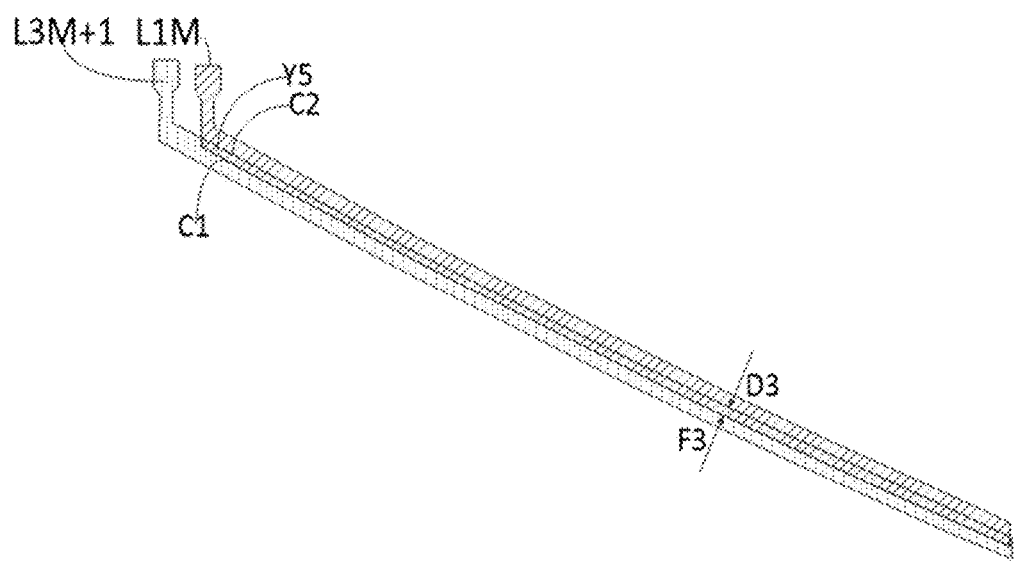
FIG. 24 is a schematic diagram of the positional relationship between the (M+1)th third data signal lead L3M+1 and the Mth first data signal lead L1M in FIG. 23.

As shown in FIG. 24, the overlapping region between the orthographic projection of the Mth first data signal lead L1M on the base substrate and the orthographic projection of the (M+1)th third data signal lead L3M+1 on the base substrate is a fifth overlapping region Y5;

the edge of the fifth overlapping region Y5 comprises a first side edge C1 and a second side edge C2 which are oppositely arranged, and the length of the first side edge C1 and the length of the second side edge C2 are both greater than the length of the other sides of the edge of the fifth overlapping region Y5;

the longest distance in the third direction F3 between a point on the first side edge C1 and the second side edge C2 is a third distance D3; and the third distance D3 is within the third distance range.

In at least one embodiment shown in FIG. 24, the first side edge C1 may comprise a plurality of interconnected line segments (the extension directions of the plurality of interconnected line segments are substantially the same), then the extension direction of a tangent to a point on the first side edge C1 is the same as the extension direction of the line segment on which the point is located, and the third direction F4 may be perpendicular to the extension direction, but is not limited thereto.

In at least one embodiment shown in FIG. 24, the third directions F3 corresponding to different points on the first side edge C1 may differ from each other and only one point on the third side edge C3 corresponding to the fourth direction F4 is shown in FIG. 24.

In at least one embodiment of the present disclosure, the first side edge C1 and the second side edge C2 may also be replaced with arc-shaped side edges.

Figure 25:
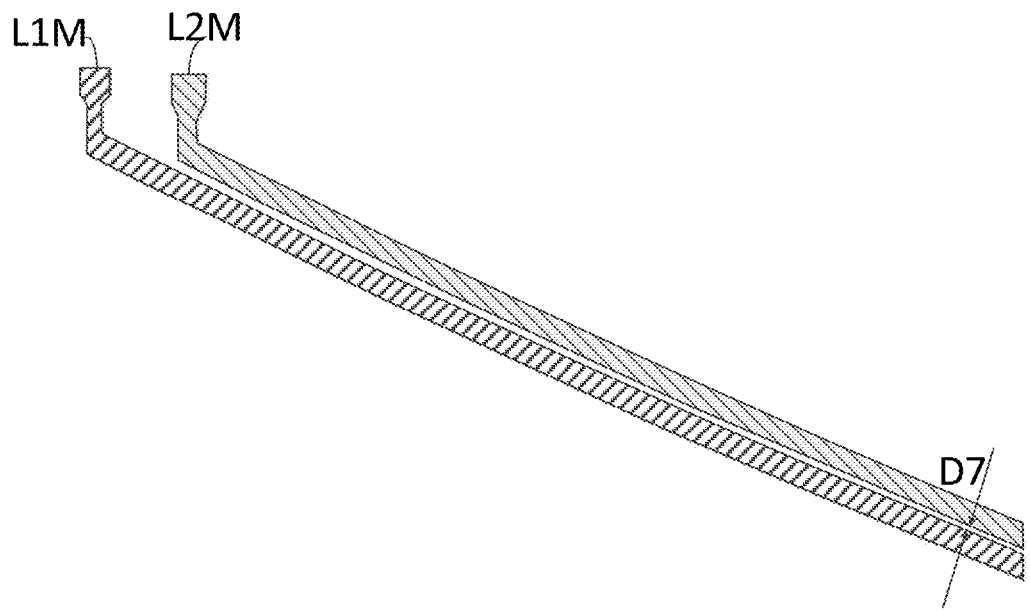
FIG. 25 is a schematic diagram of the positional relationship between the Mth first data signal lead L1M and the Mth second data signal lead L2M in FIG. 23.

As shown in FIG. 25, the shortest distance between the orthographic projection of the Mth first data signal lead L1M on the base substrate and the orthographic projection of the Mth second data signal lead L2M on the base substrate is a seventh distance D7; the seventh distance D7 is within the first distance range.

Figure 26:
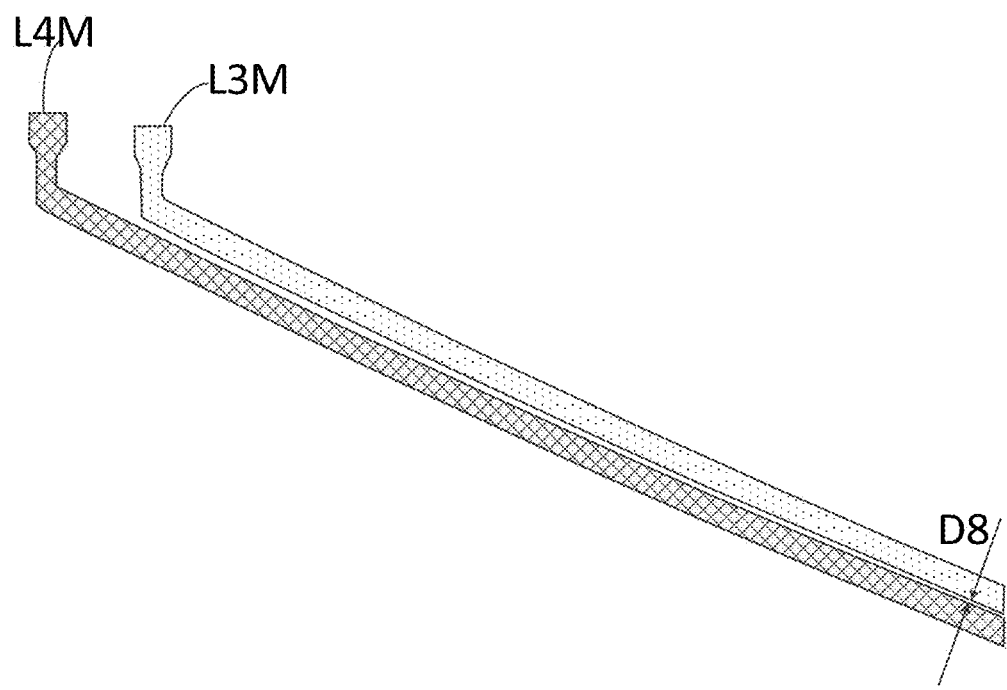
FIG. 26 is a schematic diagram of the positional relationship between the Mth third data signal lead L3M and the Mth fourth data signal lead L4M in FIG. 23.

As shown in FIG. 26, the shortest distance between the orthographic projection of the Mth third data signal lead L3M on the base substrate and the orthographic projection of the Mth fourth data signal lead L4M on the base substrate is an eighth distance D8; the eighth distance D8 is within the first distance range.

In at least one embodiment of the present disclosure, the line widths of the first data signal leads, the second data signal leads, the third data signal leads, and the fourth data signal leads are all within a line width range.

Optionally, the line width range is greater than or equal to 1.6 um to less than or equal to 2.2 um, but is not limited thereto.

In at least one embodiment of the present disclosure, the display substrate further comprises a second source and drain metal layer, wherein the second source and drain metal layer is arranged on a side of the metal wiring layer away from the first source and drain metal layer.

In particular implementations, the second source and drain metal layer may comprise a DC voltage line, but is not limited thereto.

The method for manufacturing a display substrate according to an embodiment of the present disclosure, wherein the at least four metal layers of the display substrate comprise: a first metal layer, a second metal layer, a third metal layer, and a fourth metal layer; the method for manufacturing the display substrate comprises:

manufacturing the first metal layer on the base substrate and performing a patterning process on the first metal layer to form the first data signal leads in the frame region;

manufacturing the insulating layer and the second metal layer successively on one side of the first metal layer away from the base substrate and performing a patterning process on the second metal layer to form the second data signal leads in the frame region;

manufacturing the insulating layer and the third metal layer successively on one side of the second metal layer away from the base substrate and performing a patterning process on the third metal layer to form the third data signal leads in the frame region;

manufacturing the insulating layer and the fourth metal layer successively on one side of the third metal layer away from the base substrate and performing a patterning process on the fourth metal layer to form the fourth data signal leads in the frame region; and orthographic projections of the data signal leads of at least two non-adjacent the metal layers on the base substrate are at least partially overlapped.

The display device according to an embodiment of the present disclosure comprises the above display substrate.

The display device according to at least one embodiment of the present disclosure further comprises a source driver provided in the frame region of the display substrate;

the source driver is electrically connected to a plurality of data signal leads of the display substrate for supplying corresponding data voltages to the plurality of data signal leads.

The display device according to at least one embodiment of the present disclosure may comprise a pixel having a GGRB pixel structure.

Figure 27:
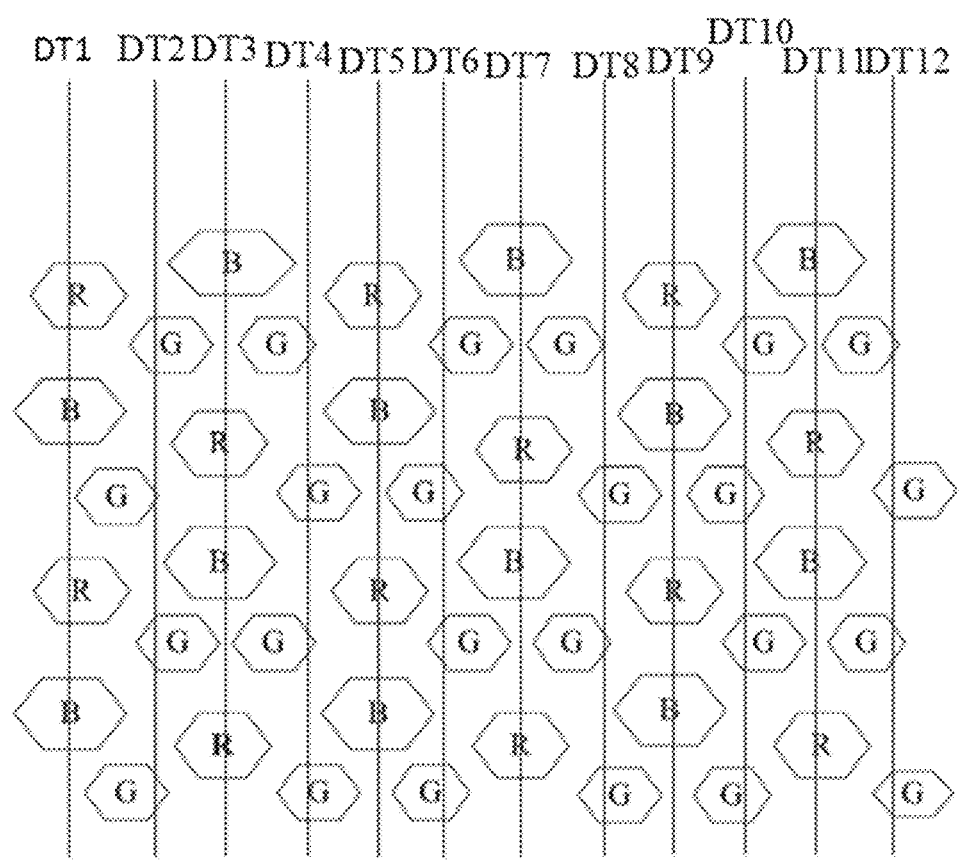
FIG. 27 is a schematic diagram of the connection relationship between each sub-pixel comprised in a display substrate and a corresponding data line according to at least one embodiment of the present disclosure.

A schematic diagram of the connection relationship between the GGRB pixel structure and the data line is shown in FIG. 27, but is not limited thereto.

In FIG. 27, G denotes a green sub-pixel, R denotes a red sub-pixel, B denotes a blue sub-pixel, DT1 denotes a first data line, DT2 denotes a second data line, DT3 denotes a third data line, DT4 denotes a fourth data line, DT5 denotes a fifth data line, DT6 denotes a sixth data line, DT7 denotes a seventh data line, DT8 denotes an eighth data line, DT9 denotes a ninth data line, DT10 denotes a tenth data line, DT11 denotes an eleventh data line, and DT12 denotes a twelfth data line.

Optionally, the display device according to at least one embodiment of the present disclosure may be a AMOLED display device, but is not limited thereto.

The display device according to the embodiments of the present disclosure can be any product or component having a display function such as a mobile phone, a tablet computer, a television, a display, a notebook computer, a digital photo frame, a navigator, and the like.

While the foregoing is directed to the preferred embodiments of the present disclosure, it will be understood by those skilled in the art that various changes may be made and equivalents may be substituted for elements thereof without departing from the principles of the present disclosure.

What is claimed is:

1. A display substrate, comprising: a base substrate, at least four metal layers laminated in a direction away from the base substrate, a display region, a frame region arranged on at least one side of the display region, and a plurality of data lines are at least partially arranged in the display region, wherein
   an insulating layer is provided between two adjacent the metal layers;
   in the frame region, each of the at least four metal layers comprises a plurality of data signal leads;
   each of the plurality of data signal leads is coupled to a corresponding data lines; and
   orthographic projections of the data signal leads of at least two of the metal layers on the base substrate are at least partially overlapped;
   wherein the at least four metal layers comprise: a first gate metal layer, a second gate metal layer, a first source and drain metal layer, and a metal wiring layer which are successively arranged on the base substrate, wherein
   the first gate metal layer comprises a plurality of first data signal leads, the second gate metal layer comprises a plurality of second data signal leads, the first source and drain metal layer comprises a plurality of third data signal leads, and the metal wiring layer comprises a plurality of fourth data signal leads;
   wherein the orthographic projection of the second data signal leads on the base substrate partially overlaps the orthographic projection of the third data signal leads on the base substrate;
   wherein an overlapping area between the orthographic projection of data signal leads included in two non-adjacent metal layers on the base substrate is greater than an overlapping area between the orthographic projection of the second data signal leads on the base substrate and the orthographic projection of the third data signal leads on the base substrate.

2. The display substrate according to claim 1, further comprising a plurality of power lines arranged in the display region, wherein
   the plurality of power lines is arranged on the same layer as the third data signal leads.

3. The display substrate according to claim 1, further comprising a second source and drain metal layer, wherein the second source and drain metal layer is arranged on a side of the metal wiring layer away from the first source and drain metal layer;
   the data lines are arranged in the second source and drain metal layer.

4. The display substrate according to claim 1, wherein the orthographic projection of the first data signal leads on the base substrate partially overlaps the orthographic projection of the third data signal leads on the base substrate;
   the orthographic projection of the first data signal leads on the base substrate partially overlaps the orthographic projection of the fourth data signal leads on the base substrate; and
   the orthographic projection of the second data signal leads on the base substrate partially overlaps the orthographic projection of the fourth data signal leads on the base substrate.

5. The display substrate according to claim 1, wherein the orthographic projection of the first data signal leads on the base substrate does not overlap the orthographic projection of the second data signal leads on the base substrate, and the orthographic projection of the third data signal leads on the base substrate does not overlap the orthographic projection of the fourth data signal leads on the base substrate.

6. The display substrate according to claim 5, wherein a shortest distance between the orthographic projection of the first data signal leads on the base substrate and the orthographic projection of the second data signal leads on the base substrate is within a first distance range;
   the shortest distance between the orthographic projection of the third data signal leads on the base substrate and the orthographic projection of the fourth data signal leads on the base substrate is within a second distance range; and
   the first distance range is greater than or equal to 0.3 um and less than or equal to 0.8 um, and the second distance range is greater than or equal to 0.3 um and less than or equal to 0.8 um.

7. The display substrate according to claim 4, wherein the frame region comprises a first region, wherein
   in the first region, the first data signal leads comprise a first lead portion extending in a first direction, the second data signal leads comprise a second lead portion extending in the first direction, the third data signal leads comprise a third lead portion extending in the first direction, and the fourth data signal leads comprise a fourth lead portion extending in the first direction; the orthographic projection of the first lead portion on the base substrate partially overlaps the orthographic projection of the third lead portion on the base substrate; the orthographic projection of the first lead portion on the base substrate partially overlaps the orthographic projection of the fourth lead portion on the base substrate; and the orthographic projection of the second data signal leads on the base substrate partially overlaps the orthographic projection of the fourth data signal leads on the base substrate;
   in the first region, the region where the orthographic projection of the first lead portion on the base substrate overlaps with the orthographic projection of the third lead portion on the base substrate is a first overlapping region, the region where the orthographic projection of the first lead portion on the base substrate overlaps with the orthographic projection of the fourth lead portion on the base substrate is a second overlapping region, and the region where the orthographic projection of the second lead portion on the base substrate overlaps with the orthographic projection of the fourth lead portion on the base substrate is a third overlapping region;
   a maximum width of the first overlapping region in a second direction is within a first width range; the maximum width of the second overlapping region in the second direction is within a second width range; the maximum width of the third overlapping region in the second direction is within a third width range;
   the second direction intersects the first direction; and
   the first width range is greater than or equal to 0.2 um and less than or equal to 0.4 um, the second width range is greater than or equal to 0.2 um and less than or equal to 0.5 um, and the third width range is greater than or equal to 0.7 um and less than or equal to 1.6 um.

8. The display substrate according to claim 3, wherein the frame region comprises a first region, wherein
in the first region, the second data signal leads comprise the second lead portion extending in the first direction and the third data signal leads comprise the third lead portion extending in the first direction; the orthographic projection of the second lead portion on the base substrate partially overlaps the orthographic projection of the third lead portion on the base substrate;
the region where the orthographic projection of the second lead portion on the base substrate overlaps with the orthographic projection of the third lead portion on the base substrate is a fourth overlapping region;
the maximum width of the fourth overlapping region in the second direction is within a fourth width range;
the second direction intersects the first direction; and
the fourth width range is greater than or equal to 0.1 um and less than or equal to 0.5 um.

9. The display substrate according to claim 4, wherein the frame region comprises a first region, a first rounded corner region provided on a first side of the first region, and a second rounded corner region provided on a second side of the first region, wherein the first side and the second side are opposite to each other;
in the first and the second rounded corner regions, the region where the orthographic projection of the first data signal leads on the base substrate overlaps with the orthographic projection of the third data signal leads on the base substrate is a fifth overlapping region, an edge of the fifth overlapping region comprises a first side edge and a second side edge which are arranged opposite to each other, and the lengths of the first side edge and the second side edge are both greater than the lengths of the other side edges of the edge of the fifth overlapping region, the longest distance in a third direction between a point on the first side edge and the second side edge is within a third distance range, and the third direction intersects a direction in which a tangent to the first side edge extends at the point;
in the first and the second rounded corner regions, the region where the orthographic projection of the first data signal leads on the base substrate overlaps with the orthographic projection of the fourth data signal leads on the base substrate is a sixth overlapping region, the sixth overlapping region comprises a third side edge and a fourth side edge which are arranged opposite to each other, and the lengths of the third side edge and the fourth side edge are both greater than the lengths of the other side edges of the edge of the sixth overlapping region, the longest distance in a fourth direction between a point on the third side edge and the fourth side edge is within a fourth distance range, and the fourth direction intersects a direction in which a tangent to the third side edge extends at the point;
in the first and the second rounded corner regions, the region where the orthographic projection of the second data signal leads on the base substrate overlaps with the orthographic projection of the fourth data signal leads on the base substrate is a seventh overlapping region, the seventh overlapping region comprises a fifth side edge and a sixth side edge which are arranged opposite to each other, and the lengths of the fifth side edge and the sixth side edge are both greater than the lengths of the other side edges of the edge of the seventh overlapping region, the longest distance in a fifth direction between a point on the fifth side edge and the sixth side edge is within a fifth distance range, and the fifth direction intersects a direction in which a tangent to the fifth side edge extends at the point; and
the third distance range is greater than or equal to 0.2 um and less than or equal to 0.4 um, the fourth distance range is greater than or equal to 0.2 um and less than or equal to 0.5 um, and the fifth distance range is greater than or equal to 0.7 um and less than or equal to 1.6 um.

10. The display substrate according to claim 4, wherein the frame region comprises a first region, a first rounded corner region provided on a first side of the first region, and a second rounded corner region provided on a second side of the first region, wherein the first side and the second side are opposite to each other;
in the first and the second rounded corner regions, the region where the orthographic projection of the second data signal leads on the base substrate overlaps with the orthographic projection of the third data signal leads on the base substrate is a eighth overlapping region, the eighth overlapping region comprises a seventh side edge and an eighth side edge which are arranged opposite to each other, and the lengths of the seventh side edge and the eighth side edge are both greater than the lengths of the other side edges of the edge of the eighth overlapping region, the longest distance in a sixth direction between a point on the seventh side edge and the eighth side edge is within a sixth distance range, and the sixth direction intersects a direction in which a tangent to the seventh side edge extends at the point;
the sixth distance range is greater than or equal to 0.1 um and less than or equal to 0.5 um.

11. The display substrate according to claim 1, wherein the line widths of the first data signal leads, the second data signal leads, the third data signal leads, and the fourth data signal leads are within a line width range;
the line width range is greater than or equal to 1.6 um and less than or equal to 2.2 um.

12. A method for manufacturing the display substrate according to claim 1, wherein the at least four metal layers of the display substrate comprise: a first metal layer, a second metal layer, a third metal layer, and a fourth metal layer; the method for manufacturing the display substrate comprises:
manufacturing the first metal layer on the base substrate and performing a patterning process on the first metal layer to form the first data signal leads in the frame region;
manufacturing the insulating layer and the second metal layer successively on one side of the first metal layer away from the base substrate and performing a patterning process on the second metal layer to form the second data signal leads in the frame region;
manufacturing the insulating layer and the third metal layer successively on one side of the second metal layer away from the base substrate and performing a patterning process on the third metal layer to form the third data signal leads in the frame region;
manufacturing the insulating layer and the fourth metal layer successively on one side of the third metal layer away from the base substrate and performing a patterning process on the fourth metal layer to form the fourth data signal leads in the frame region; and wherein orthographic projections of the data signal leads of at least two non-adjacent the metal layers on the base substrate are at least partially overlapped.

13. A display device, comprising a display substrate, the display substrate comprising:
- a base substrate, at least four metal layers laminated in a direction away from the base substrate, a display region, a frame region arranged on at least one side of the display region, and a plurality of data lines are at least partially arranged in the display region, wherein an insulating layer is provided between two adjacent the metal layers;
- in the frame region, each of the at least four metal layers comprises a plurality of data signal leads;
- each of the plurality of data signal leads is coupled to a corresponding data lines; and
- orthographic projections of the data signal leads of at least two of the metal layers on the base substrate are at least partially overlapped;
- wherein the at least four metal layers comprise: a first gate metal layer, a second gate metal layer, a first source and drain metal layer, and a metal wiring layer which are successively arranged on the base substrate, wherein
- the first gate metal layer comprises a plurality of first data signal leads, the second gate metal layer comprises a plurality of second data signal leads, the first source and drain metal layer comprises a plurality of third data signal leads, and the metal wiring layer comprises a plurality of fourth data signal leads;
- wherein the orthographic projection of the second data signal leads on the base substrate partially overlaps the orthographic projection of the third data signal leads on the base substrate;
- wherein an overlapping area between the orthographic projection of data signal leads included in two non-adjacent metal layers on the base substrate is greater than an overlapping area between the orthographic projection of the second data signal leads on the base substrate and the orthographic projection of the third data signal leads on the base substrate.

14. The display device according to claim 13, further comprising a source driver provided in the frame region of the display substrate; wherein
the source driver is electrically connected to the plurality of data signal leads of the display substrate for supplying corresponding data voltages to the plurality of data signal leads.

* * * * *